(12) United States Patent
Oyamada et al.

(10) Patent No.: US 7,973,320 B2
(45) Date of Patent: Jul. 5, 2011

(54) ORGANIC SEMICONDUCTOR LIGHT-EMITTING DEVICE AND DISPLAY USING SAME

(75) Inventors: Takahito Oyamada, Tsurugashima (JP); Hiroyuki Uchiuzo, Fukuoka (JP); Chihaya Adachi, Fukuoka (JP)

(73) Assignees: Kyoto University, Kyoto (JP); Pioneer Corporation, Tokyo (JP); Hitachi, Ltd., Tokyo (JP); Rohm Co., Ltd., Kyoto (JP)

( * ) Notice: Subject to any disclaimer, the term of this patent is extended or adjusted under 35 U.S.C. 154(b) by 733 days.

(21) Appl. No.: 11/661,282

(22) PCT Filed: Aug. 26, 2005

(86) PCT No.: PCT/JP2005/015525
§ 371 (c)(1),
(2), (4) Date: Sep. 17, 2007

(87) PCT Pub. No.: WO2006/025274
PCT Pub. Date: Mar. 9, 2006

(65) Prior Publication Data
US 2008/0164460 A1 Jul. 10, 2008

(30) Foreign Application Priority Data
Aug. 30, 2004 (JP) .................................. 2004-250600

(51) Int. Cl.
*H01L 27/15* (2006.01)
(52) U.S. Cl. .......................................... 257/79; 257/40
(58) Field of Classification Search ................... 257/40, 257/79
See application file for complete search history.

(56) References Cited

U.S. PATENT DOCUMENTS

| | | |
|---|---|---|
| 2002/0105005 A1 | 8/2002 | Seo et al. |
| 2006/0243970 A1 | 11/2006 | Seo et al. |
| 2007/0024179 A1* | 2/2007 | Oyamada et al. ............. 313/498 |

FOREIGN PATENT DOCUMENTS

| | | |
|---|---|---|
| CN | 1370034 A | 9/2002 |
| JP | 05-315078 | 11/1993 |
| JP | 2002-083685 | 3/2002 |
| JP | 2002-313584 | 10/2002 |
| JP | 2003-282884 | 10/2003 |

OTHER PUBLICATIONS

Sakanoue, T. et al, "Visible light emission from polymer-based field-effect transistors", Applied Physics Letters, vol. 84, No. 16, Apr. 19, 2004, pp. 3037-3039.

* cited by examiner

*Primary Examiner* — Ken A Parker
*Assistant Examiner* — Anthony Ho
(74) *Attorney, Agent, or Firm* — Rabin & Berdo, P.C.

(57) ABSTRACT

An organic semiconductor light-emitting device having the form of a field-effect transistor and a display using this device is provided. In the device, electrons and holes can be transported. The device comprises an organic semiconductor light-emitting layer capable of emitting light by recombination of holes and electrons, a hole injection electrode for injecting holes into the organic semiconductor light-emitting layer, an electron injection electrode for injecting electrons into the organic semiconductor light-emitting layer, and a gate electrode so disposed as to be opposed to the organic semiconductor light-emitting layer between the electrodes. When a control voltage is applied to the gate electrode, the carrier distribution in the organic semiconductor light-emitting layer is controlled. Thus, the light emission can be turned on/off and the emission intensity can be modulated.

15 Claims, 17 Drawing Sheets

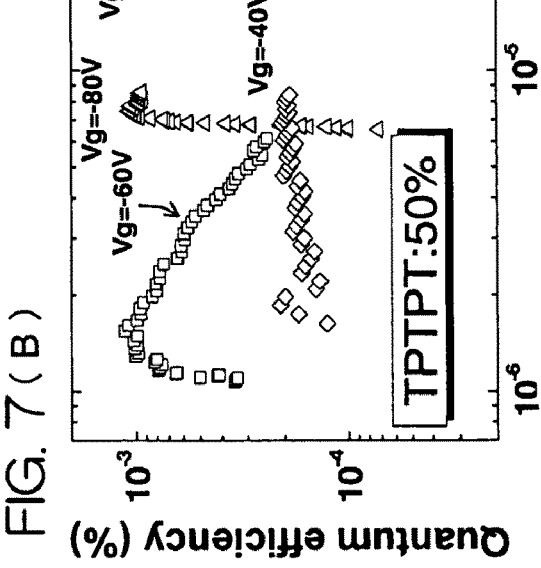
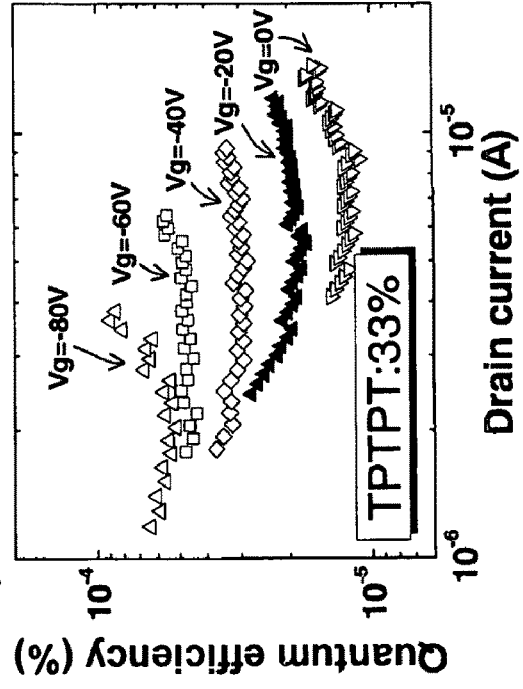
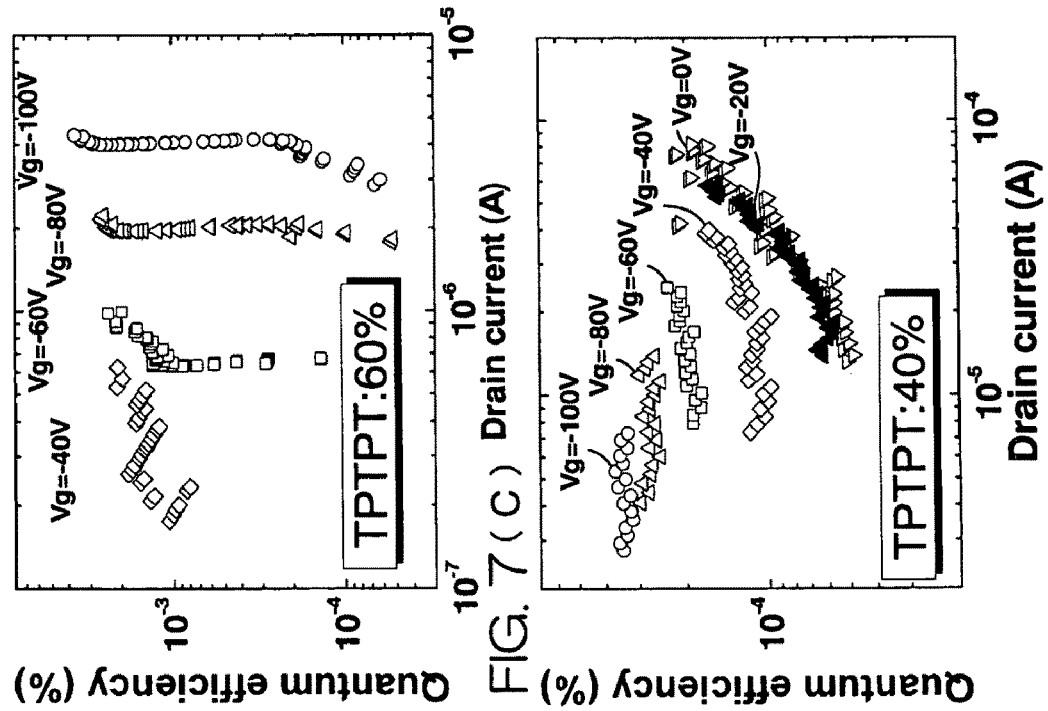

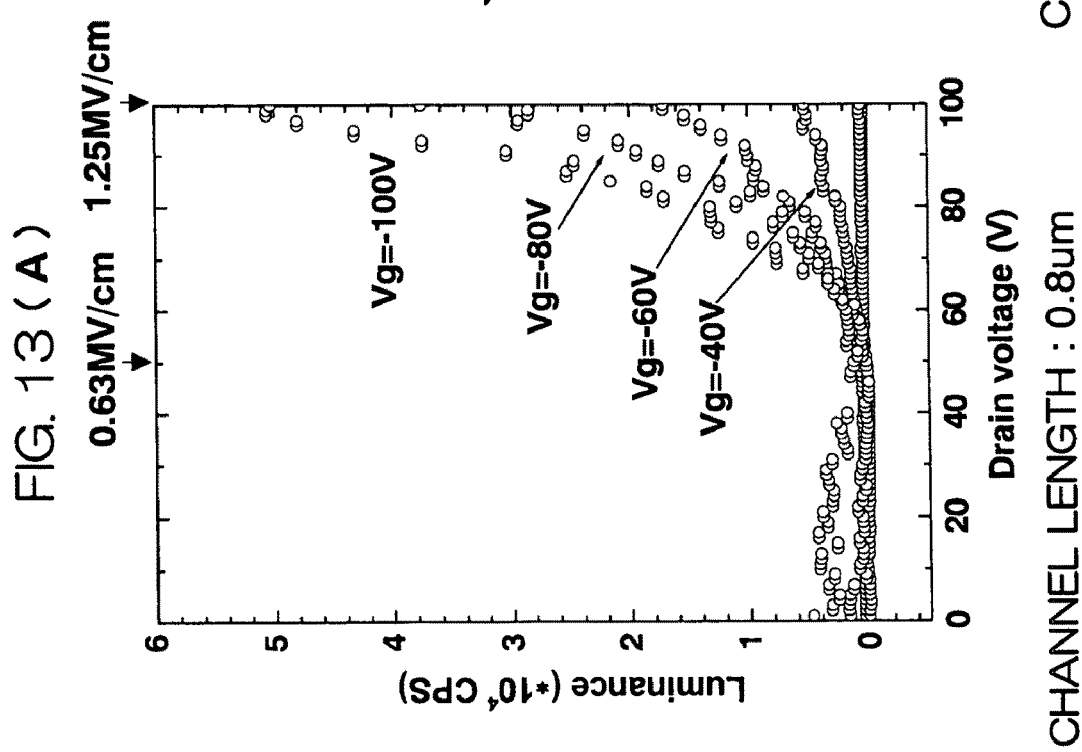

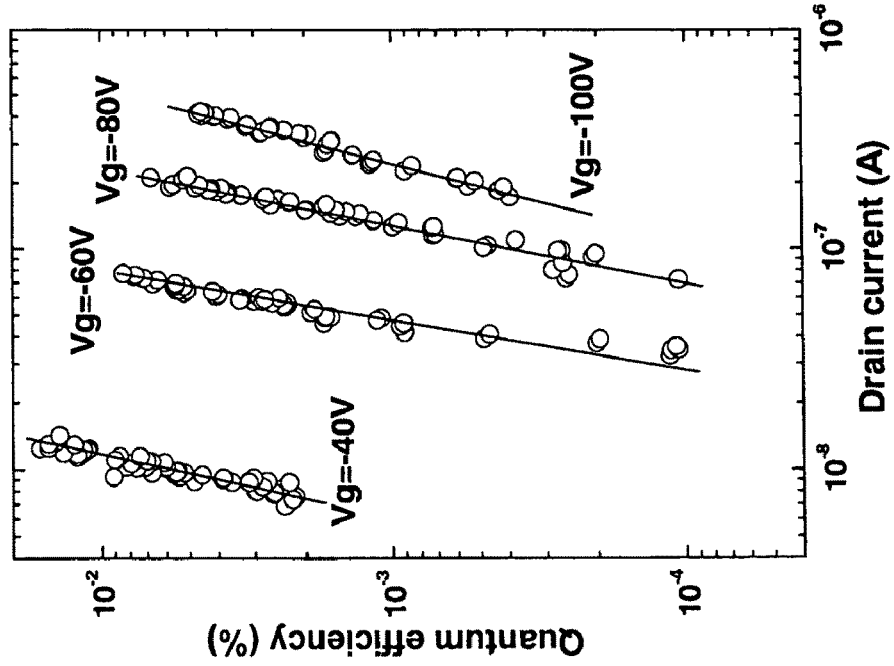

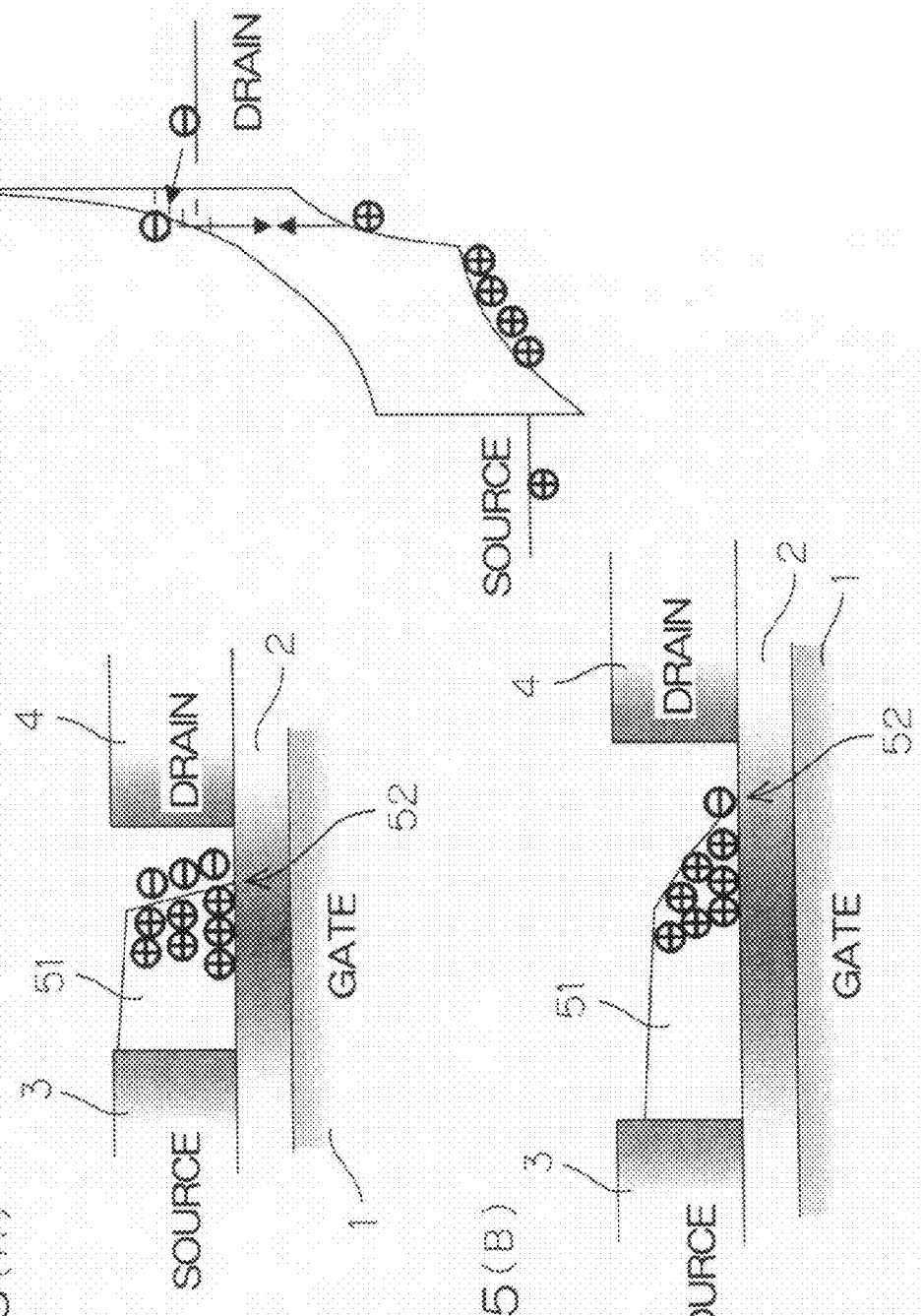

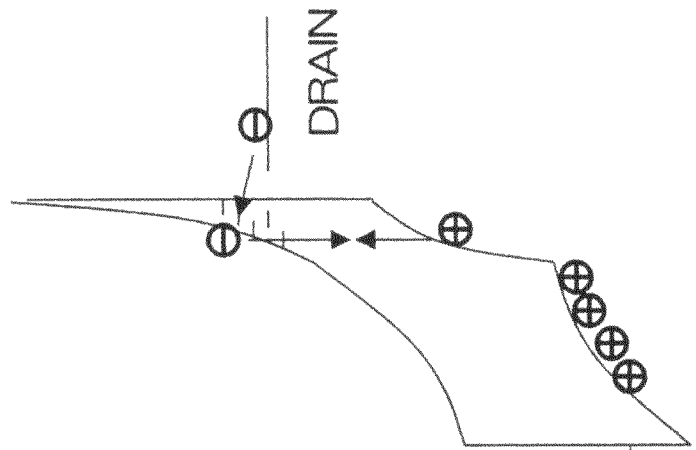
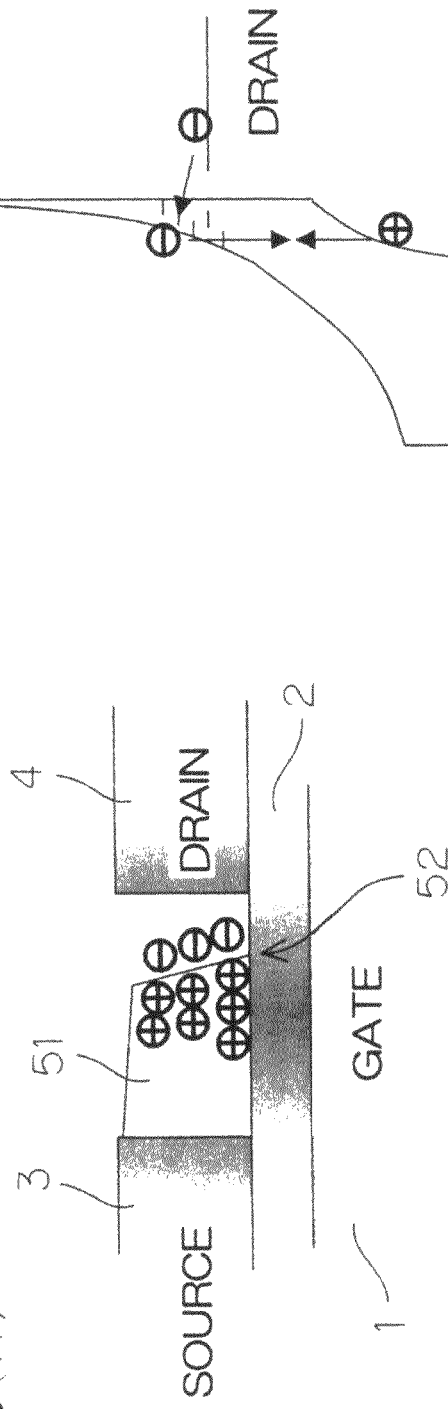
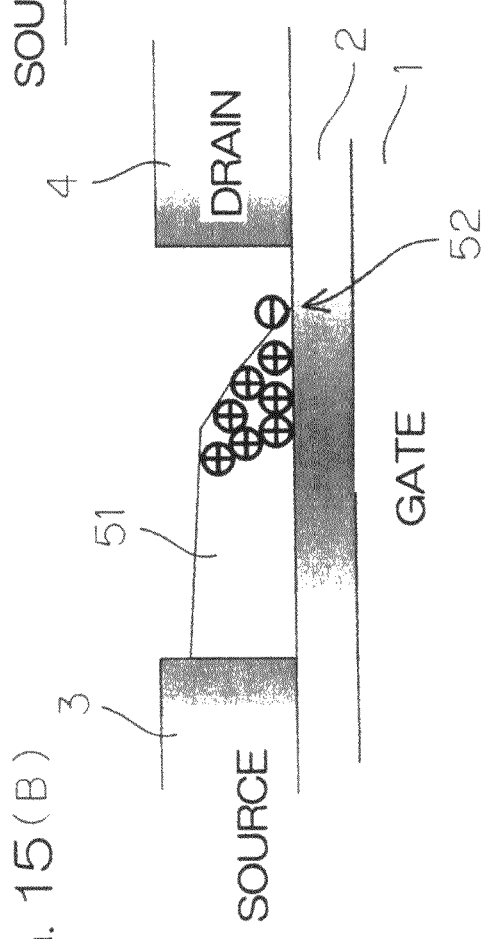

ORGANIC SEMICONDUCTOR LIGHT-EMITTING DEVICE AND DISPLAY USING SAME

TECHNICAL FIELD

The present invention relates to an organic semiconductor device that comprises an organic semiconductor layer and a display using the same.

BACKGROUND ART

An organic EL (electroluminescence) device, a typical example of an organic semiconductor device, is a light emitting element which utilizes a luminous phenomenon during recombination of electrons and holes in an organic semiconductor layer. More specifically, the organic EL device comprises an organic semiconductor light emitting layer, an electron injecting electrode for injecting electrons to the organic semiconductor light emitting layer, and a hole injecting electrode for injecting holes to the organic semiconductor light emitting layer (Patent Reference 1).

The light emission of such organic electroluminescence element is turned on/off by turning on/off a voltage applied between the hole injecting electrode and the electron injecting electrode. Further, emission intensity is modulated by variably controlling the voltage applied between the hole injecting electrode and the electron injecting electrode.

Patent Reference 1: Japanese Unexamined Patent Publication No. 05-315078 (1993)

DISCLOSURE OF THE INVENTION

Problem to be Solved by the Invention

When a two-dimensional display device is made by arranging a plurality of luminescence pixels in two-dimensional array (matrix array), the aforementioned conventional organic electroluminescence element has a difficulty in driving, so that it is preferred to adopt a form of field-effect transistor.

However, no successful example of a field-effect transistor using an organic semiconductor has been reported, nor an organic semiconductor light-emitting device which is a form of field-effect transistor has been implemented.

Accordingly, an object of the present invention is to provide an organic semiconductor light-emitting device which has a form of field-effect transistor and a display using the same.

Means for Solving the Problem

In one aspect of the present invention, there is provided an organic semiconductor light-emitting device which comprises an organic semiconductor light-emitting layer which is capable of transporting holes and electrons and emits light by recombination of the holes and the electrons, a hole injecting electrode for injecting holes to the organic semiconductor light-emitting layer, an electron injecting electrode spaced a predetermined distance from the hole injecting electrode for injecting electrodes to the organic semiconductor light-emitting layer, and a gate electrode arranged opposed to the organic semiconductor light-emitting layer between the hole injecting electrode and the electron injecting electrode for controlling distribution of carriers in the organic semiconductor light-emitting layer.

According to this structure, use of a bipolar organic semiconductor light-emitting layer which can transport holes and electrons allows recombination of holes injected from the hole injecting electrode and electrons injected from the electron injecting electrode in the organic semiconductor light-emitting layer, causing light emission. In addition, the gate electrode is disposed so as to oppose the organic semiconductor light-emitting layer positioned between the hole injecting electrode and the electron injecting electrode. This makes organic semiconductor light-emitting device to have the basic form of a field-effect transistor. Therefore, application of control voltage to the gate electrode allows control of carrier distribution in the organic semiconductor light-emitting layer. Consequently, on/off of emission light and modulation of emission intensity can be controlled.

The organic semiconductor light-emitting layer can comprise a P-type organic semiconductor material which is a hole transporting material and an N-type organic semiconductor material which is an electron transporting material. With this structure, since the organic semiconductor light-emitting layer includes the P-type organic semiconductor material and the N-type organic semiconductor material, both holes and electrons can be transported smoothly. This can generate recombination of holes and electrons in the organic semiconductor light-emitting layer efficiently.

Furthermore, the organic semiconductor light-emitting layer can comprise a mixture of a P-type organic semiconductor material and an N-type organic semiconductor material. With this structure, since the organic semiconductor light-emitting layer comprises the mixture of a P-type organic semiconductor material and an N-type organic semiconductor material, recombination of holes and electrons in the organic semiconductor light-emitting layer can be realized efficiently. In this regards, by setting a mixture ratio of the P-type organic semiconductor material and the N-type organic semiconductor material appropriately, balance of injection quantities of holes and electrons injected from the hole injecting electrode and the electron injecting electrode respectively can be controlled. This enables light emission more efficiently.

The organic semiconductor light-emitting layer can be made by codeposition of a P-type organic semiconductor material and an N-type organic semiconductor material.

Additionally, it is preferable that the organic semiconductor light-emitting layer further comprises a light-emitting material forming an emission center. This enables more efficient light emission. The light-emitting material in this case is an organic but has no transportation function of electrons and holes.

In this case, it is preferable that the organic semiconductor light-emitting layer is made by codeposition of the P-type organic semiconductor material, the N-type organic semiconductor material and the light-emitting material.

It is preferable that the light-emitting material is a material having less difference between HOMO (highest occupied molecular orbital) energy level and LUMO (lowest unoccupied molecular orbital) energy level than at least either one of P-type organic semiconductor material or N-type organic semiconductor material.

The organic semiconductor light-emitting layer can have a laminated structure laminating a P-type organic semiconductor layer formed of a P-type organic semiconductor material and an N-type organic semiconductor layer formed of an N-type organic semiconductor material. With this arrangement, the organic semiconductor light-emitting layer which can transport both holes and electrons comprises the laminated structure laminating the P-type organic semiconductor layer and the N-type organic semiconductor layer. This structure also can cause recombination of holes and electrons in the organic semiconductor light-emitting layer with the laminated structure. Consequently, the organic semiconductor light-emitting device having the basic form of a field-effect transistor can be achieved.

The P-type organic semiconductor material preferably includes co-oligomer of thiophene and phenylene. The co-oligomer of thiophene and phenylene is π electron conjugated system material in which thiophene ring and benzene ring are one-dimensionally ringed. One example of this (thiophene/phenylene) co-oligomer is TPTPT (2.5-bis (4-(2'thiopheneyl)phenyl)thiophene).

Moreover, it is preferable that the N-type organic semiconductor material includes naphthalene anhydride. One example of naphthalene anhydride compound is NTCDA (naphthalene tetracarboxylic dianhydride).

For the P-type organic semiconductor material, acene derivative, pyrene derivative, perylene derivative and fluorene derivative are applicable in addition to (thiophene/phenylene) co-oligomer, and materials with these structures including stilbene also can be used. As a matter of course, one having high emission quantum yield is preferable.

Furthermore, for the N-type organic semiconductor material, perylene derivative, fullerene derivative and the like can be used in addition to naphthalene anhydride. Moreover, a material in which the aforementioned P-type material is fluoridated can be used, as well.

In another aspect of the present invention, there is provided an organic semiconductor light-emitting device which comprises an organic semiconductor light-emitting layer which is capable of being injected either holes or electrons for emitting light by recombination holes and electrons, a hole injecting electrode for injecting holes to the organic semiconductor light-emitting layer, an electron injecting electrode disposed with 1.0 μm or less space from the hole injecting electrode for injecting electrodes to the organic semiconductor light-emitting layer, and a gate electrode arranged opposed to the organic semiconductor light-emitting layer between the hole injecting electrode and the electron injecting electrode for controlling distribution of carriers in the organic semiconductor light-emitting layer.

With this arrangement, the organic semiconductor light-emitting device having the form of field-effect transistor which uses the organic semiconductor light-emitting layer capable of transporting either holes or electrons as active layer can be achieved. In this invention, the space between the hole injecting electrode and the electron injecting electrode is very short distance of 1.0 μm or less. In other words, the channel length is determined as very short distance of 1.0 μm.

With this arrangement, application of appropriate voltage to the gate electrode positions a pinch-off point of carriers induced on the gate electrode surface of the organic semiconductor light-emitting layer to be near either hole injecting electrode or electron injecting electrode. Accordingly, high electrical field is generated at the space between the pinch-off point and the electrodes, so that carriers move over potential barrier between electrodes and the organic semiconductor light-emitting layer.

This causes recombination of holes and electrons at the proximity of the pinch-off point, emitting light consequently. In such manner, even if the organic semiconductor light-emitting layer which is capable of transporting either holes or electrons is used, set of very short channel length allows efficient light emission.

The organic semiconductor light-emitting layer furthermore can comprise a light-emitting material which forms emission center. With this arrangement, by forming emission center in the organic semiconductor light-emitting layer, more efficient light emission can be achieved.

The organic semiconductor light-emitting layer can comprise co-oligomer of thiophene and phenylene.

The hole injecting electrode and the electron injecting electrode respectively may have comb shape portions arranged in spaced relation which are configured to be engaged each other. With this arrangement, since the hole injecting electrode and the electron injecting electrode have comb shape portions arranged in spaced relation which are configured to be engaged with each other, the whole length of the portion where the hole injecting electrode and the electron injecting electrode are opposed to each other can be made long. In other words, the channel length can be made wide. This allows effective recombination of holes and electrons, enabling low voltage drive while achieving high emission efficiency. Furthermore, by making the comb shape portion wide to be visible as surface emission condition, substantial surface light emission source can be realized.

A one-dimensional or two-dimensional display, of which each image is composed of organic semiconductor light-emitting devices, can be constructed by arranging such organic semiconductor devices one-dimensionally or two-dimensionally on a substrate.

Aforementioned and further objects, features, and advantages of the present invention will become apparent from the following description of embodiments by reference to the appended drawings.

BRIEF DESCRIPTION OF THE DRAWINGS

FIGS. 7(A) to 7(D) are diagrams showing measurement results of quantum efficiency for drain current in the case of P-type drive. FIG. 7(A) shows a characteristic of the case where TPTPT content is 60 mol %, FIG. 7(B) shows a characteristic of the case where TPTPT content is 50 mol %, FIG. 7(C) shows a characteristic of the case where TPTPT content is 40 mol %, and FIG. 7(D) shows a characteristic of the case where TPTPT content is 33 mol %.

FIG. 8(A) shows a characteristic of the case where TPTPT content is 60 mol %, FIG. 8(B) shows a characteristic of the case where TPTPT content is 50 mol %, FIG. 8(C) shows a characteristic of the case where TPTPT content is 40 mol %, and FIG. 8(D) shows a characteristic of the case where TPTPT content is 33 mol %.

FIG. 13(A) shows a luminance characteristic for drain voltage in the case of channel length L=0.8 µm, and FIG. 13(B) shows a luminance characteristic for drain voltage in the case of channel length L=9.8 µm.

FIG. 14(A) is a characteristic chart showing a quantum efficiency for drain voltage in the case of channel length L=0.8 µm, FIG. 14(B) shows a characteristic of the same in the case of channel length L=9.8 µm.

FIG. 15(A) to 15(C) are diagrams for describing a mechanism of light emission in an organic semiconductor light-emitting layer.

MODE FOR CARRYING OUT THE INVENTION

Figure 1:
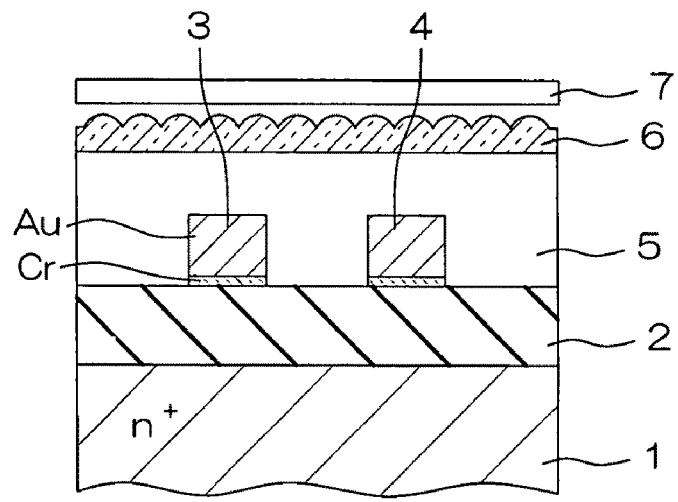
FIG. 1 is a schematic sectional view for describing an arrangement of an organic semiconductor light-emitting device according to a first embodiment of the present invention.

FIG. 1 is a schematic sectional view for describing an arrangement of an organic semiconductor light-emitting device according to the first embodiment of the present invention. The organic semiconductor light-emitting device is an element which has the basic structure of an FET (field-effect transistor). The organic semiconductor device comprises: a gate electrode 1 constructed by highly concentrated impurities doped $N^+$ silicon substrate; a silicon oxide film 2 (e.g., film thickness 300 nm) laminated on the gate electrode 1 as a insulating film; a pair of electrodes 3, 4 formed spaced apart from each other on the silicon oxide film 2; and an organic semiconductor light-emitting layer 5 formed so as to cover the pair of electrodes 3, 4 and to be sandwiched by the electrodes 3, 4. The gate electrode 1 may be constructed by conductive layer comprising impurity diffusion layer formed on the surface part of a silicon substrate.

A lens 6 comprising such as plastic lens for enhancing the light extraction efficiency is disposed so as to be opposite to the organic semiconductor light-emitting layer 5, and a polarizer 7 is disposed so as to cover the lens 6 in order to enhance visibility.

The organic semiconductor light-emitting layer 5 is formed by a mixture of TPTPT that is a P-type organic semiconductor material shown in the Chemical Formula 1 below and NTCDA that is an N-type organic semiconductor material shown in the Chemical Formula 2. TPTPT is a hole transporting material which has $5.1 \times 10^{-3}$ cm$^2$/V·s of carrier mobility, 5.0 eV of HOMO energy level, and 1.3 eV of LUMO energy level. NTCDA is an electron transporting material which has $3.4 \times 10^{-4}$ cm$^2$/V·s of carrier mobility, less than 6.8 eV of HOMO energy level, and about 3.6 eV of LUMO energy level.

[Chemical Formula 1]

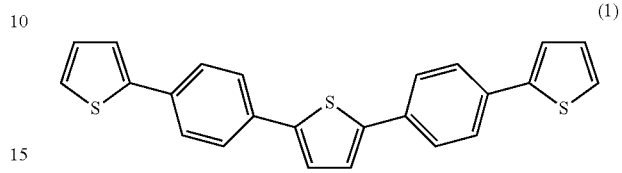

(1)

[Chemical Formula 2]

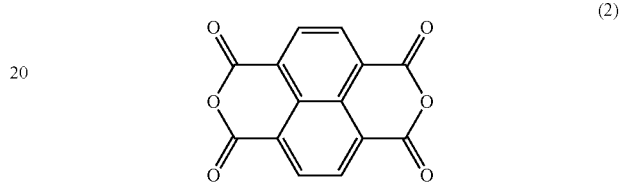

(2)

Specifically, the organic semiconductor light-emitting layer 5 is formed by codeposition of TPTPT and NTCDA, of which film thickness is, for example, 70 nm. It is preferable that the organic semiconductor light-emitting layer 5 is further doped a light-emitting material (that forms emission center) with less difference between HOMO and LUMO energy levels than TPTPT or NTCDA. In this case, the organic semiconductor light-emitting layer 5 can be formed by codeposition of TPTPT, NTCDA and light-emitting material. For the light-emitting material, materials with over 90% of emission quantum yield, such as Rubrene, DCM, fluorene compound, compound including stilbene, and acene derivative are preferable. Further, platinum complex such as PtOEP which is phosphorescence material and metal complex such as iridium complex can be used.

The pair of electrodes 3, 4 are configured, for example, by disposing a thin (e.g., film thickness: 1 nm) chromium layer as an adhesion layer on the silicon oxide film 2 side, and laminating a gold layer (e.g., film thickness: 30 nm) on the chromium layer. These pair of electrodes 3, 4 are formed such that they are spaced a small distance such as 1 µm to oppose to each other along the surface of the silicon oxide film 2, that is, along the surface of the gate electrode 1 as substrate. The organic semiconductor light-emitting layer 5 exists in a region between the pair of electrodes 3, 4, and the gate electrode 1 opposes to the organic semiconductor light-emitting layer 5 in this region while interposing the silicon oxide film 2.

Since the organic semiconductor light-emitting layer 5 comprises the mixture of the P-type organic semiconductor material and the N-type organic semiconductor material, application of a voltage between the pair of electrodes 3, 4 moves both of holes and electrons within them. Then, by recombination of these holes and electrons in the organic semiconductor light-emitting layer 5, light is emitted. At that time, the quantity of carriers (holes and electrons) moving between the electrodes 3, 4 through the organic semiconductor light-emitting layer 5 depends on voltage applied to the gate electrode 1. Therefore, by applying a voltage which changes gradually or continuously to gate electrode 1, the conducting state (on/off or current flow amount) of the pair of electrodes 3, 4 (source, drain electrode) can be controlled.

Since the organic semiconductor light-emitting layer 5 is bipolar organic semiconductor layer which can transport both holes and electrons, this organic semiconductor device can carry out either type drive of a P-type drive or N-type drive.

For example, when a P-type drive is carried out, a negative voltage is applied to the electrode 4 while setting the electrode 3 as a source electrode and a reference and the electrode 4 as a drain electrode. In this condition, a negative control voltage is applied to the gate electrode 1 with the source electrode 3 as a reference. Holes in the organic semiconductor light-emitting layer 5 are thus attracted to the side of the gate electrode 1, and the density of holes near the surface of the silicon oxide film 2 goes high. By appropriately setting a voltage between the source electrode 3 and the drain electrode 4, the holes are injected from the source electrode 3 to the organic semiconductor light-emitting layer gate electrode 1 depending on the force of control voltage applied, and a condition where the electrons are injected from the drain electrode 4 to the organic semiconductor light-emitting layer 5 is achieved. In other words, the source electrode 3 works as a hole injecting electrode, and the drain electrode 4 works as an electron injecting electrode. This generates recombination of holes and electrons in the organic semiconductor light-emitting layer 5, which brings an observation of light emission. This emission condition can be turned on/off or its emission intensity can be modulated by changing a control voltage applied to the gate electrode 1.

On the other hand, when a N-type drive is carried out, a positive voltage is applied to the electrode 4 while setting the electrode 3 as a source electrode and a reference and the electrode 4 as a drain electrode. Furthermore, a positive control voltage is applied to the gate electrode 1 with a source electrode 3 as a reference. This induces electrons near the boundary of the silicon oxide film 2 in the organic semiconductor light-emitting layer 5, which enables conduction between the source electrode 3 and the drain electrode 4. Therefore, by applying appropriate voltage between the source electrode 3 and the drain electrode 4, the electrons are injected from the source electrode 3 to the organic semiconductor light-emitting layer 5, while the holes are injected from the drain electrode 4 to the organic semiconductor light-emitting layer 5. In other words, the source electrode 3 works as an electron injecting electrode, and the drain electrode 4 works as a hole injecting electrode. Then, recombination of injected electrons and holes are generated in the organic semiconductor light-emitting layer 5. This causes light emission. This light emission condition can be turned on/off or its emission intensity can be modulated by changing a control voltage applied to the gate electrode 1.

Figure 2:
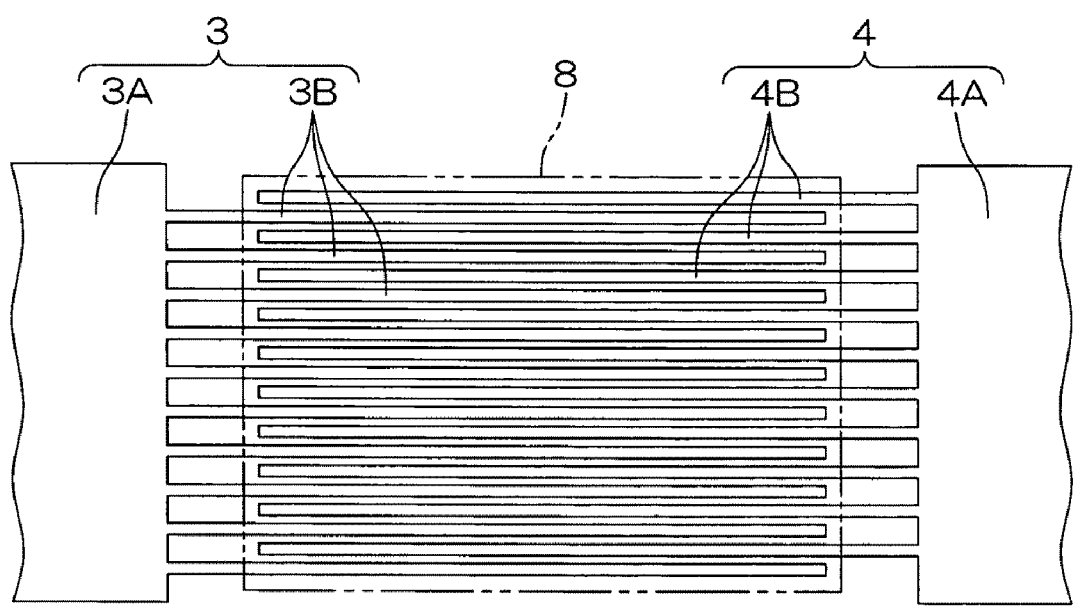
FIG. 2 is a schematic sectional plan view for describing an arrangement of source electrode and drain electrode.

As shown in the plan view of FIG. 2, the source electrode 3 and the drain electrode 4 respectively have bodies 3A, 4A and pluralities of combs 3B, 4B (10 in each, 20 in total, in the example of FIG. 2) extruding parallel to each other from the bodies 3A, 4A, which are disposed on the silicon oxide film 2 such that the combs 3B, 4B are engaging with each other with small space such as 1 μm. Each comb 3B of the source electrode 3 opposes to the combs 4B of the drain electrode 4 at the both ends, so that substantial length of the opposing part of the source electrode 3 and the drain electrode 4 is long. This enhances efficiencies of electrons injection and holes injection to the organic semiconductor light-emitting layer 5, which enables low voltage driving. The opposing part length of the source electrode 3 and the drain electrode 4 serves as a channel width, and preferably is for example, around 4 mm.

Since each comb 3B, 4B is formed to have very small width such as not more than 1 μm and the gate electrode 1 opposes to whole rectangular region 8 where the combs 3B, 4B overlap to each other, the rectangular region 8 is visually recognized as a surface light emission source during light emission.

FIGS. 3(A) to 3(D), FIGS. 4(A) to 4(D), FIGS. 5(A) to 5(D) and FIGS. 6(A) to 6(D) are diagrams showing characteristics of the aforementioned organic semiconductor light-emitting device. FIGS. 3(A) to 3(D) show a characteristic of TPTPT and NTCDA at 3:2 of mixture ratio (i.e. TPTPT content is 60 mol %), FIGS. 4(A) to 4(D) show a characteristic of the same at 1:1 of mixture ratio (i.e. TPTPT content is 50 mol %), FIGS. 5(A) to 5(D) show a characteristic of the same at 2:3 of mixture ratio (i.e. TPTPT content is 40 mol %), and FIGS. 6(A) to 6(D) show a characteristic of the same at 1:2 of mixture ratio (i.e. TPTPT content is 33 mol %). Each FIG. (A) shows a drain current which flows between the electrodes 3, 4 for drain voltage which is applied to the drain electrode 4 in the case of P-type drive. Each FIG. (B) shows the change of a drain current for drain voltage in the case of N-type drive. Each FIG. (C) shows the change of luminance for drain voltage in the case of P-type drive. Each FIG. (D) shows the change of luminance for drain voltage in the case of N-type drive. Each characteristic chart shows characteristics in the cases of 0 V, −20 V, −40 V, −60 V, −80 V, −100 V of gate voltage Vg (which is applied to the gate electrode 1) for the P-type drive, and in the cases of 0 V, 20 V, 40 V, 60 V, 80 V, 100 V of gate voltage Vg for the N-type drive, respectively.

Figure 3A:
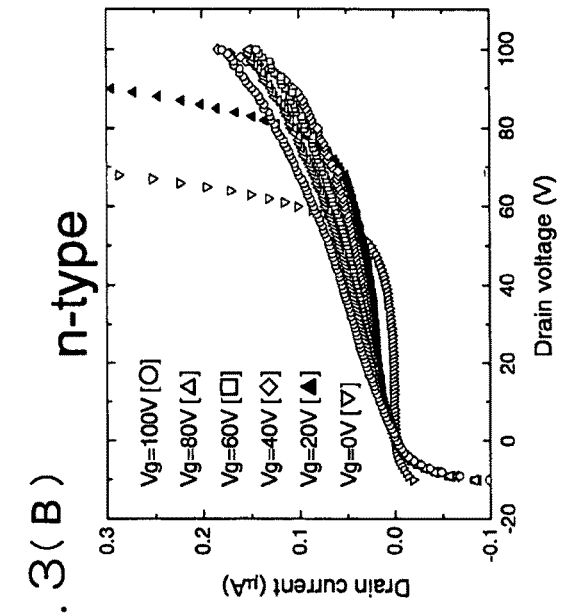
FIGS. 3(A) to 3(D) are diagrams showing characteristic of an organic semiconductor light-emitting device (TPTPT content: 60 mol %).
Figure 3B:
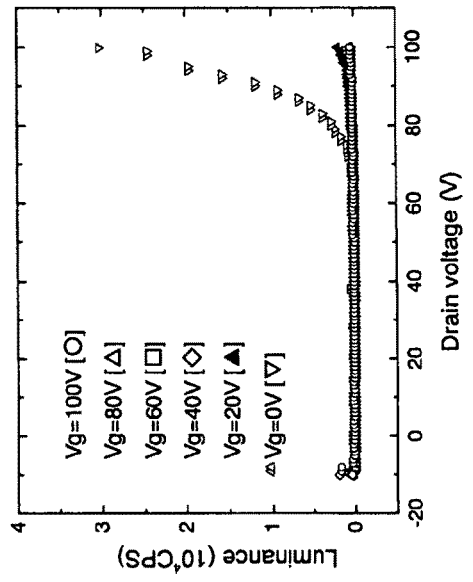
Figure 3C:
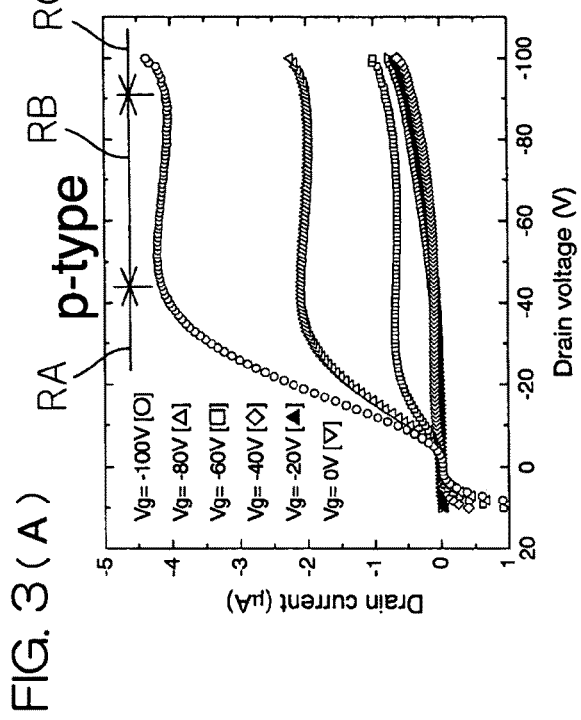
Figure 3D:
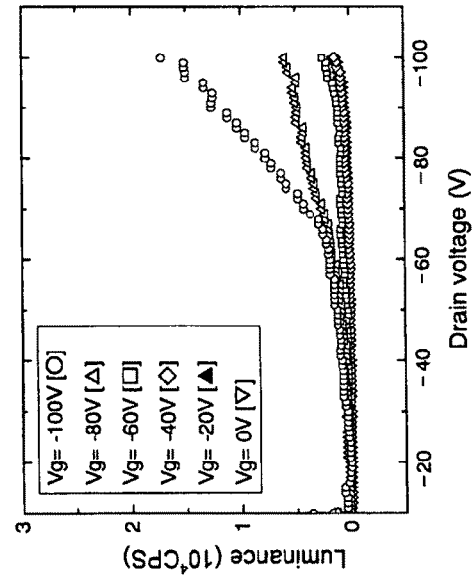

For example, the case of gate voltage Vg=−100 V in FIG. 3(A) is focused on now. The characteristic curve of drain voltage versus drain current has a liner region RA where the drain current monotonically increases (monotone increase of absolute value) in accordance with the increase of drain voltage (increase of absolute value), and a saturation region RB where the drain current saturates following the liner region RA, and a dispersion region RC where the drain current increases and disperses in accordance with the increase of drain voltage following the saturation region RB.

In the liner region RA, the saturation region RB and the dispersion region RC, the holes injection from the source electrode 3 to the organic semiconductor light-emitting layer 5 generates. In the saturation region RB and the dispersion region RC, the electrons injection from the drain electrode 4 to the organic semiconductor light-emitting layer 5, which distributes to the light emission, generates. In these regions, recombination of holes and electrons in the organic semiconductor light-emitting layer 5 and light emission following the recombination are caused.

Figure 4:
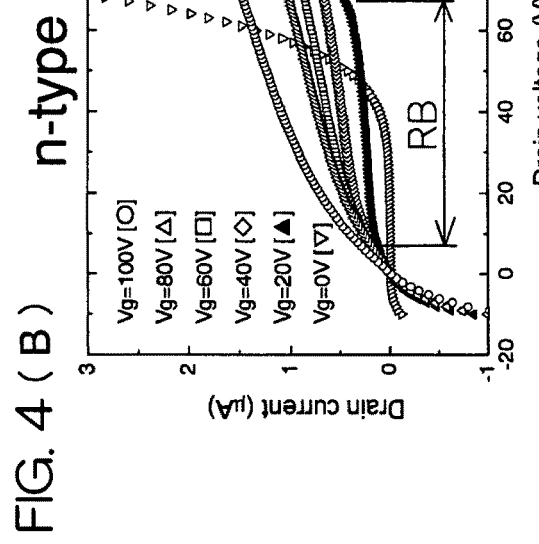
FIGS. 4(A) to 4(D) are diagrams showing characteristic of an organic semiconductor light-emitting device (TPTPT content: 50 mol %).
Figure 4:
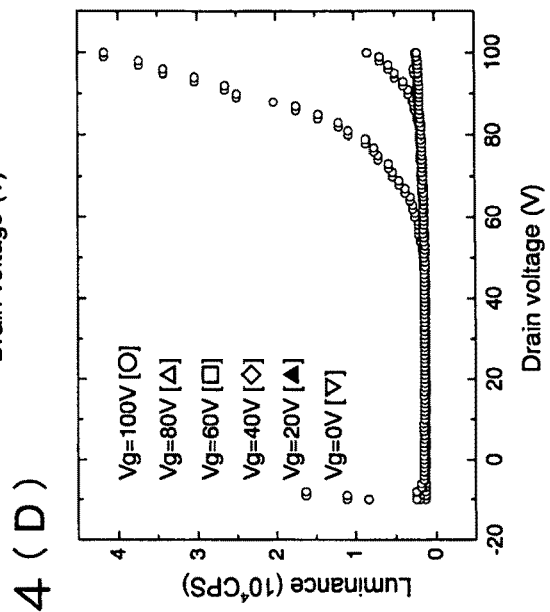
Figure 4:
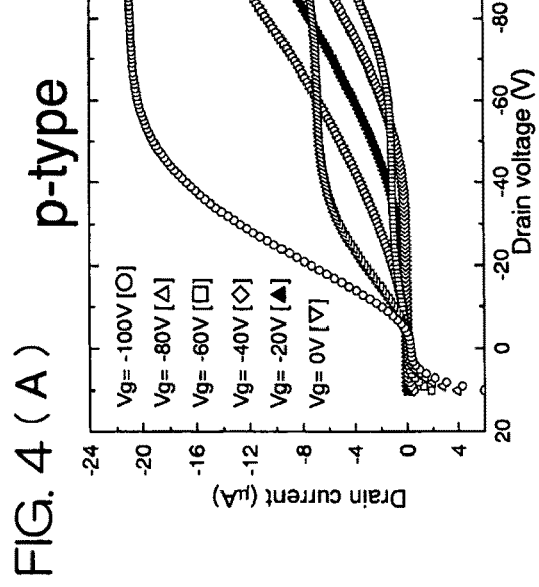
Figure 4:
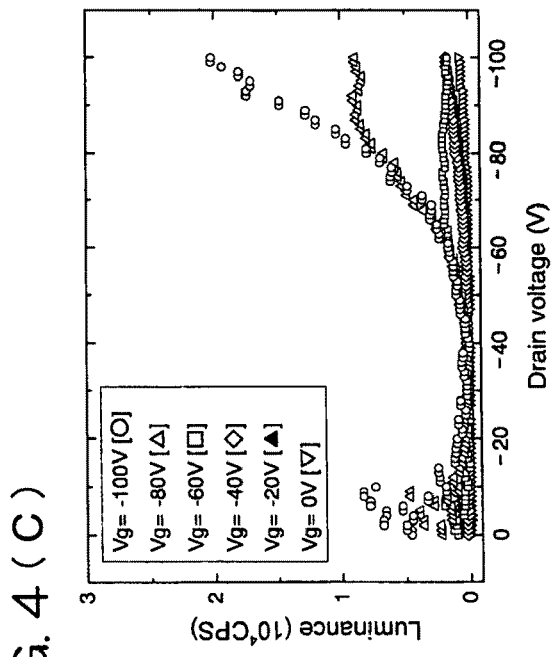
Figure 5A:
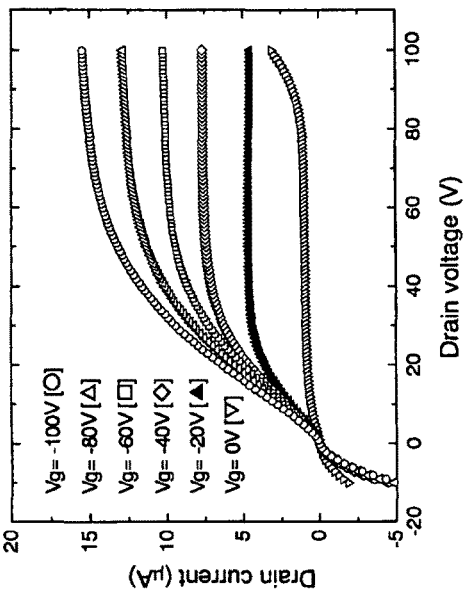
FIGS. 5(A) to 5(D) are diagrams showing characteristic of an organic semiconductor light-emitting device (TPTPT content: 40 mol %).
Figure 5B:
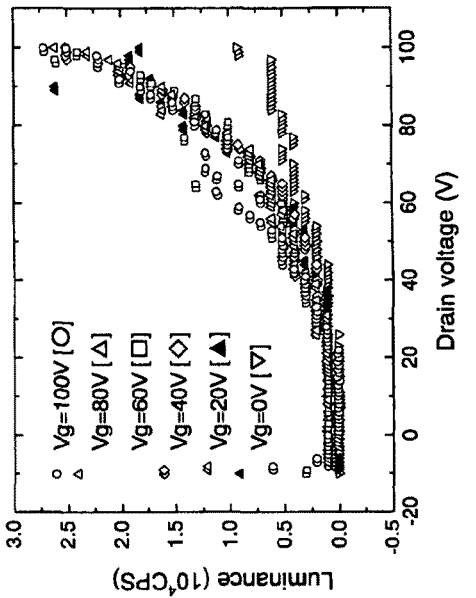
Figure 5C:
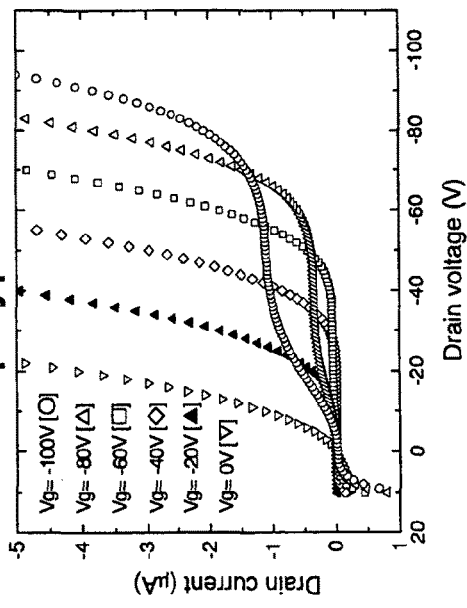
Figure 5D:
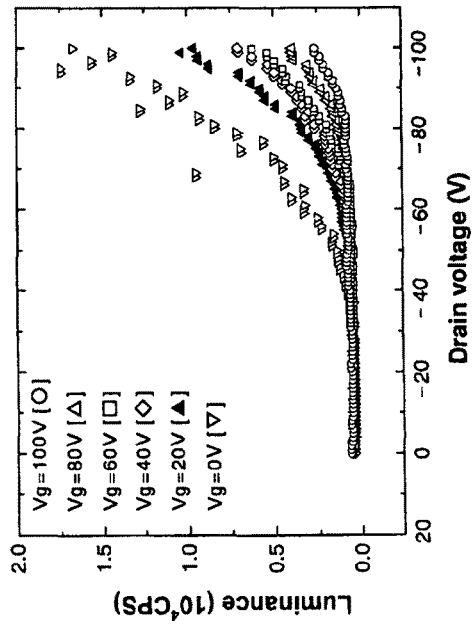
Figure 6:
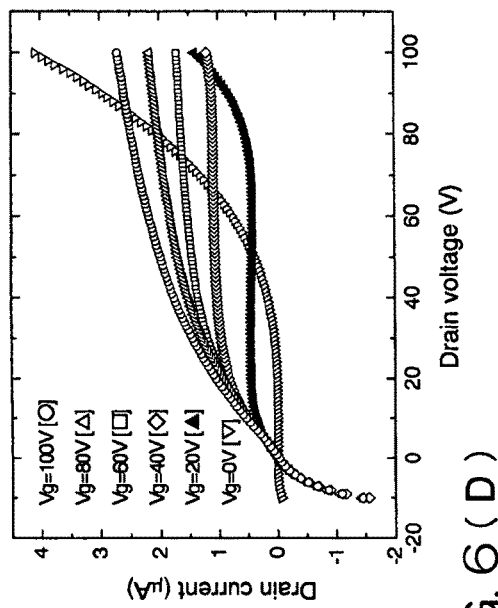
FIGS. 6(A) to 6(D) are diagrams showing characteristic of an organic semiconductor light-emitting device (TPTPT content: 33 mol %).
Figure 6:
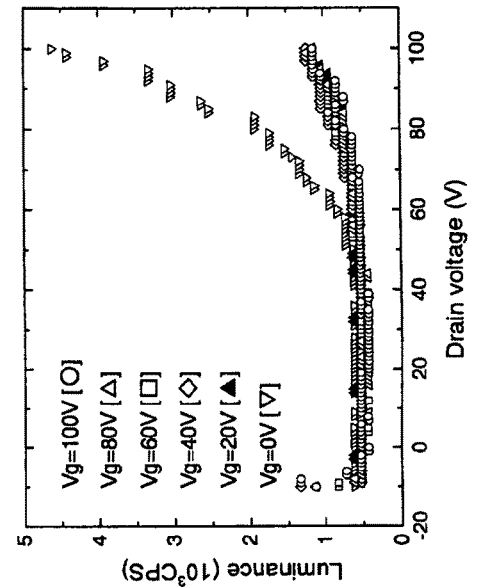
Figure 6:
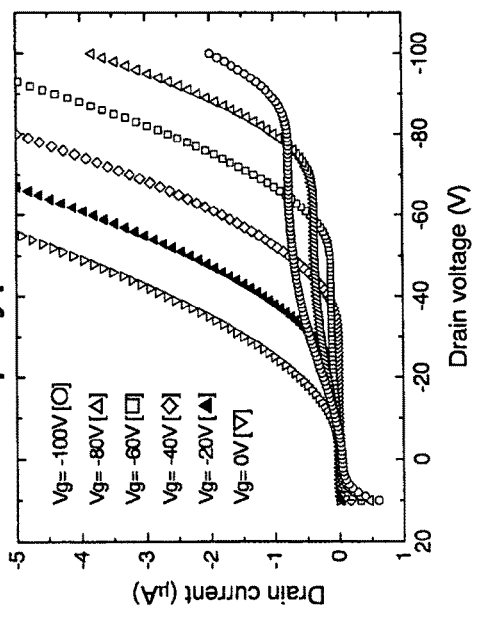
Figure 6:
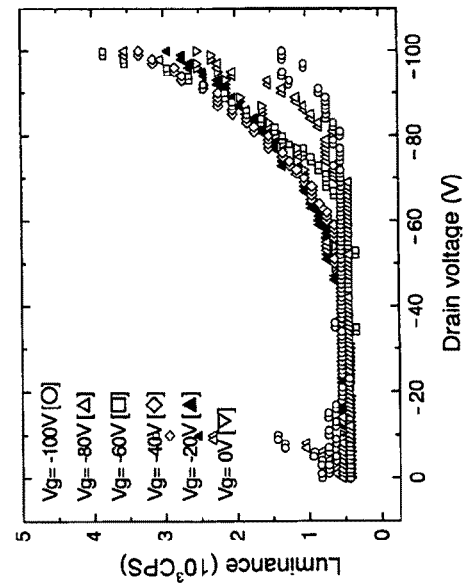

Now, the case of gate voltage Vg=20 V in FIG. 4(B) is focused on. The characteristic curve of drain voltage versus drain current has a saturation region RB where the drain current saturates and a dispersion region RC where the drain current increases and disperses in accordance with the increase of drain voltage following the saturation region RB. Since this case is the N-type drive, in the saturation region RB and the dispersion region RC, the electrons injection from the source electrode 3 to the organic semiconductor light-emitting layer 5 generates. When reaching the dispersion region RC, the holes dedicating to light emission is injected from the drain electrode 4 to the organic semiconductor light-emitting layer 5, and then recombination of these in the organic semiconductor light-emitting layer 5 causes light emission.

In such manner, light emission can be caused from the organic semiconductor light-emitting layer 5 which works as an active layer of a field-effect transistor.

FIGS. 7(A) to 7(D) are diagrams showing measurement results of quantum efficiency for the drain current in the case of P-type drive. FIG. 7(A) shows a characteristic of the case where TPTPT content is 60 mol %, FIG. 7(B) shows a characteristic of the case where TPTPT content is 50 mol %, FIG. 7(C) shows a characteristic of the case where TPTPT content is 40 mol %, and FIG. 7(D) shows a characteristic of the case where TPTPT content is 33 mol %.

When the change of quantum efficiency for the change of drain current is sharp, the control of light quantity by controlling the drain current is complicated. On the contrary, when the change of quantum efficiency for the change of drain current is less, the light emission quantity can be increased in accordance with the increase of the drain current, so that the control of the light emission quantity is easy. From these points, the characteristic having less change of quantum efficiency for the drain current is preferable. FIGS. 7(A) to 7(D) show that preferred drain current-quantum efficiency characteristic is obtained by setting TPTPT content to 50 mol % or less (more preferably, 40 mol % or less, further preferably, 33 mol % or less).

Figure 8A:
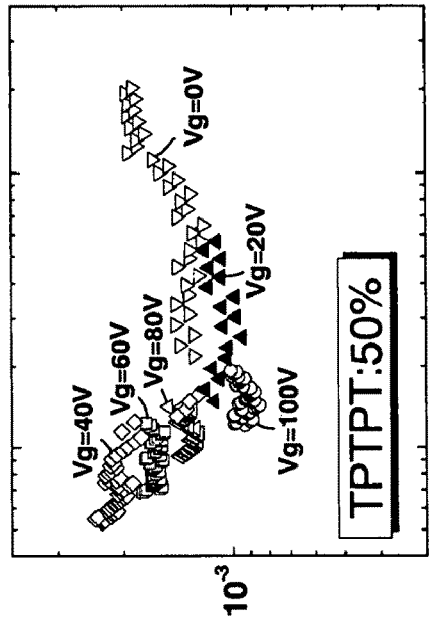
FIGS. 8(A) to 8(D) are diagrams showing measurement results of quantum efficiency for drain current in the case of N-type drive.
Figure 8B:
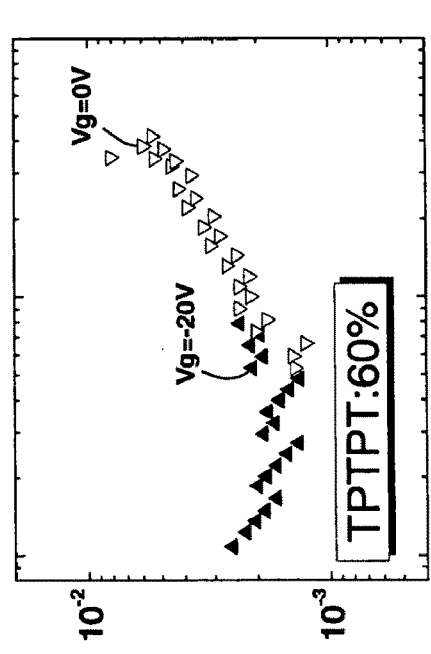
Figure 8C:
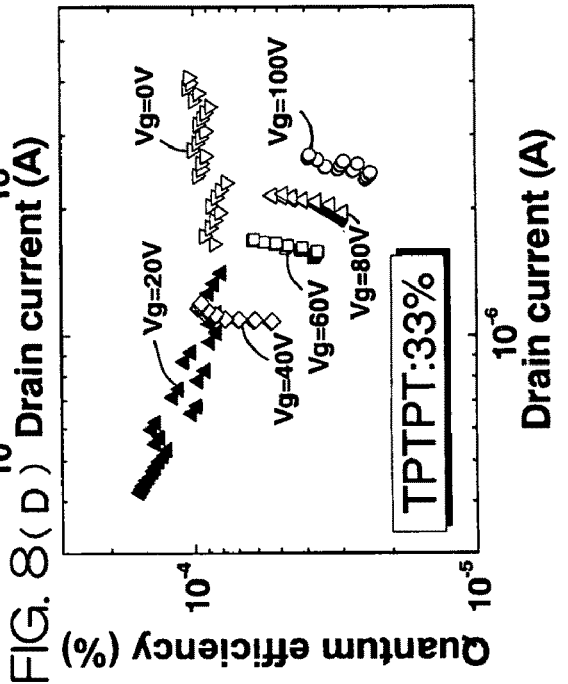
Figure 8D:
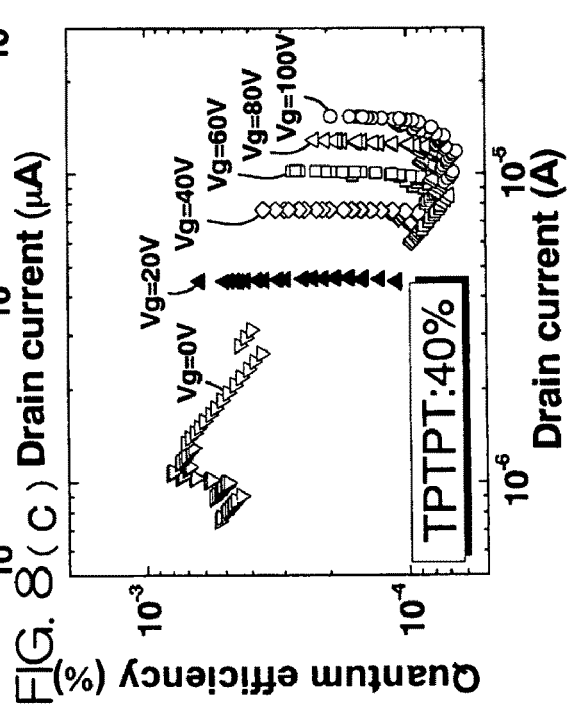

FIGS. 8(A) to 8(D) show the same characteristics in the case of the N-type drive. FIG. 8(A) shows a characteristic of the case where TPTPT content is 60 mol %, FIG. 8(B) shows a characteristic of the case where TPTPT content is 50 mol %, FIG. 8(C) shows a characteristic of the case where TPTPT content is 40 mol %, and FIG. 8(D) shows a characteristic of the case where TPTPT content is 33 mol %.

From the same points as considered in FIGS. 7(A) to 7(D), in the case of N-type drive, it is shown that the preferred drain current-quantum efficiency characteristic is obtained by setting TPTPT content to 50 mol % or more (more preferably 60 mol % or more).

Figure 9:
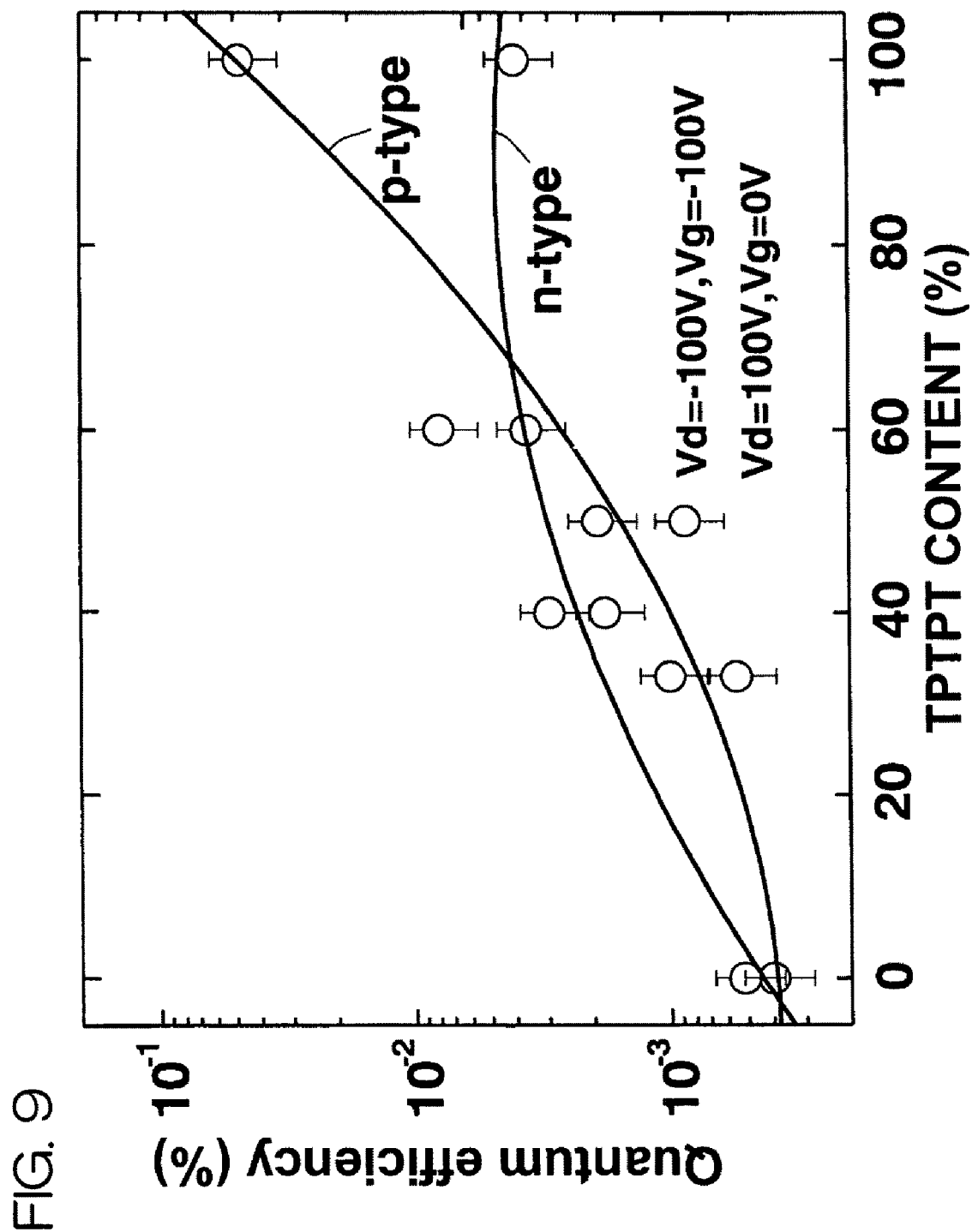
FIG. 9 is a diagram showing a change of quantum efficiency for TPTPT content.

FIG. 9 is a diagram showing the change of quantum efficiency for TPTPT content. This shows that the quantum efficiency is enhanced by increasing TPTPT content in the case of the P-type drive. On the contrary, the quantum efficiency saturates in the case of N-type drive when TPTPT content is around 70 mol %. In FIG. 9, a measurement result obtained by drain voltage Vd=−100 V and gate voltage Vg=−100 V for the P-type drive, and a characteristic of the case of drain voltage Vd=100 V and gate voltage Vg=0 V for the N-type drive are shown.

Figure 10:
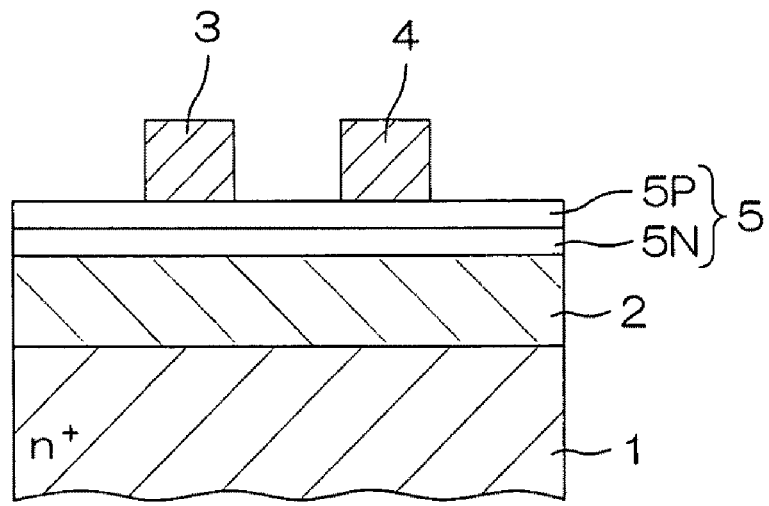
FIG. 10 is a schematic sectional view for describing an arrangement of an organic semiconductor light-emitting device according to the second embodiment of the present invention.

FIG. 10 is a schematic sectional view for describing an arrangement of an organic semiconductor light-emitting device according to a second embodiment of the present invention. In FIG. 10, each element corresponding to the element shown in FIG. 1 will be given identical reference numeral in FIG. 1.

In the embodiment, an organic semiconductor light-emitting layer 5 is constituted of a laminated structure film in which a P-type organic semiconductor layer 5P formed of TPTPT and an N-type organic semiconductor layer 5N formed of NTCDA are laminated. In FIG. 10, although the P-type organic semiconductor layer 5P is laminated on the N-type organic semiconductor layer 5N, the arrangement of these two organic semiconductor layers 5P, 5N may be the conversion of the one in FIG. 10. On the organic semiconductor light-emitting layer 5, a source electrode 3 and a drain electrode 4 are disposed with predetermined very small distance such as 25 nm.

In the embodiment, by laminating the P-type organic semiconductor layer 5P formed of a P-type organic semiconductor material which is monolayer and shows transistor characteristic and the N-type organic semiconductor layer 5N formed of an N-type material which is monolayer and shows transistor characteristic, the bipolar drivable organic semiconductor light-emitting layer 5 is constructed as a whole. The drain electrode 4 working as an electron injecting electrode in the case of P-type driving is not in contact with the N-type organic semiconductor layer 5N. However, even if in such condition, the drain electrode 4 can give/receive carriers (electrons) to/from the N-type organic semiconductor layer 5N by going through the P-type organic semiconductor layer 5P. Additionally, the source electrode 3 working as an electron injecting electrode in the case of N-type driving is not in contact with the N-type organic semiconductor layer 5N, but the source electrode 3 can give/receive carriers (electrons) to/from the N-type organic semiconductor layer 5N by going through the P-type organic semiconductor layer 5P.

To give/receive carriers, it is preferable that the thickness of the P-type organic semiconductor layer 5P is 200 nm or less. The thickness of P-type organic semiconductor layer 5P in the embodiment is 100 nm.

In such structure, recombination of holes and electrons in the organic semiconductor light-emitting layer 5 and emission following the recombination are caused similarly to the aforementioned first embodiment by carrying out the P-type drive or the N-type drive.

Figure 11:
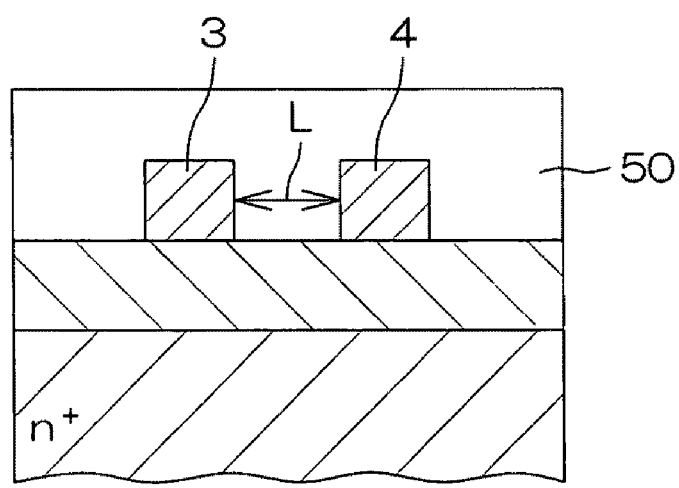
FIG. 11 is a schematic sectional view for describing an arrangement of an organic semiconductor light-emitting device according to the third embodiment of the present invention.

FIG. 11 is a schematic sectional view for describing an arrangement of an organic semiconductor light-emitting device according to a third embodiment of the present invention. In FIG. 11, each element corresponding to the element shown in FIG. 1 will be given identical reference numeral in FIG. 1. Furthermore, in description of the embodiment, FIG. 2 will be referred to again.

In the embodiment, TPTPT which is a P-type organic semiconductor material is adopted for an organic semiconductor light-emitting layer 50 working as an active layer of a field-effect transistor, and an N-type organic semiconductor material is not substantially mixed in the organic semiconductor light-emitting layer 50. In other words, the organic semiconductor light-emitting layer 50 in this embodiment is configured with monolayer of the P-type organic semiconductor material.

In this embodiment, the channel length L which is the distance between the source electrode 3 and the drain electrode 4 is 1 μm or less, more specifically 0.8 μm. The channel width which is the full length of the opposing part where the combs 3B of the source electrode 3 and the combs 4B of the drain electrode 4 are opposed to each other is, for example, 1 mm.

Figure 12:
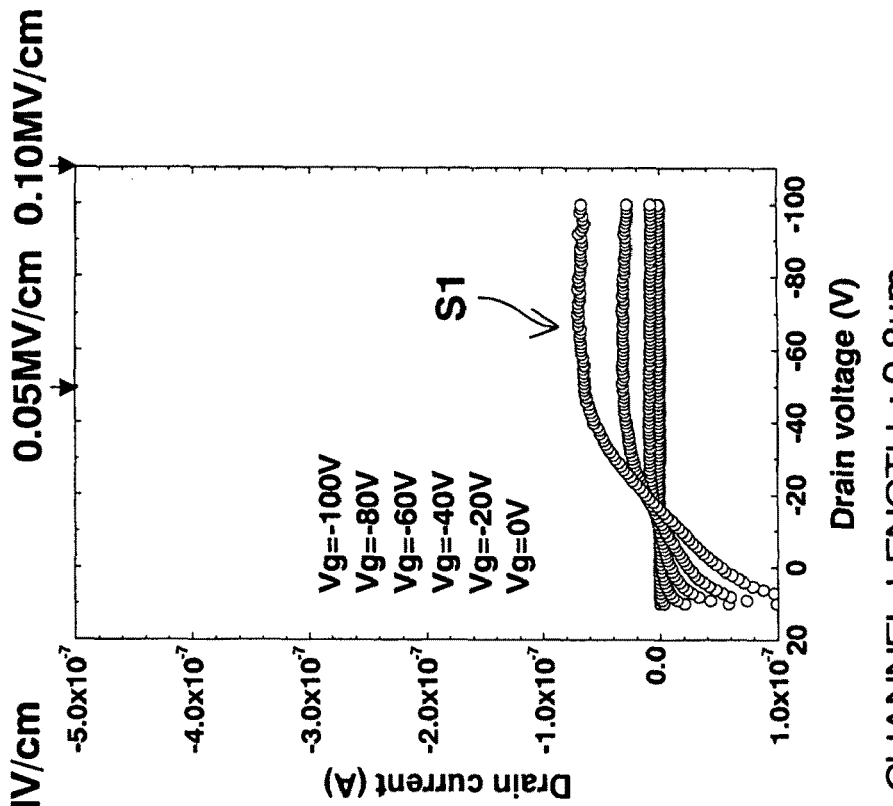
FIG. 12(A) is a characteristic chart showing a change of drain current for drain voltage in the organic semiconductor light-emitting device (channel length L=0.8 µm) shown in FIG. 11.
FIG. 12(B) is a characteristic chart showing the same in the organic semiconductor light-emitting device whose channel length is L=9.8 µm.
Figure 12:
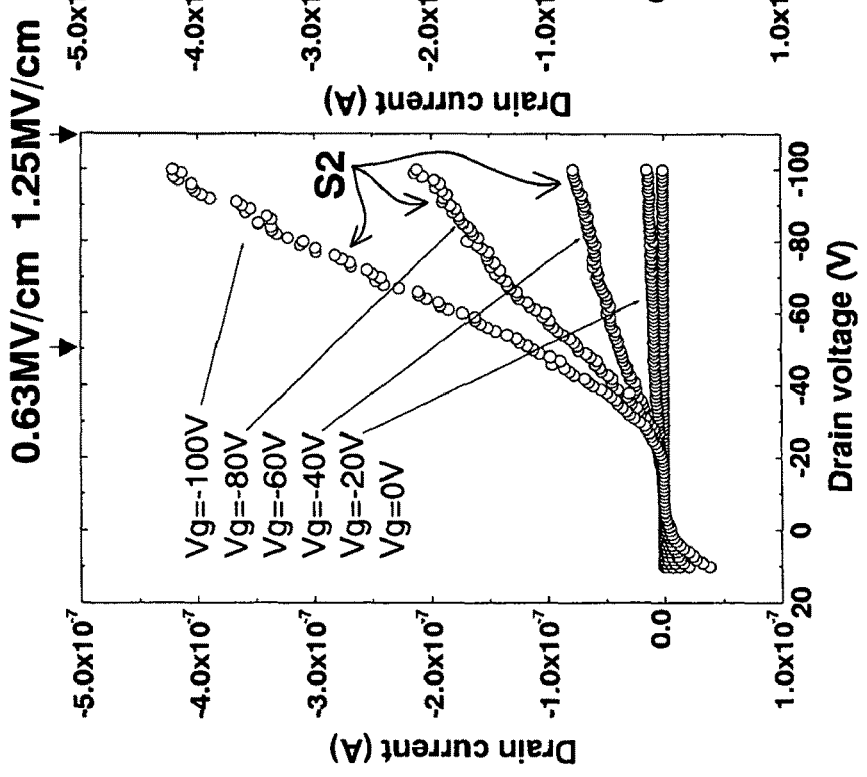

FIG. 12(A) is a characteristic chart showing a change of drain current for drain voltage in the organic semiconductor light-emitting device (channel length L=0.8 μm) shown in FIG. 11, and shows each characteristic in the case of gate voltage Vg: 0 V, −20 V, −40 V, −60 V, −80 V, −100 V. FIG. 12(B) is a characteristic chart showing the same in the organic semiconductor light-emitting device of channel length L=9.8 μm. When the channel length L is 9.8 μm, typical saturate characteristic appears as shown in reference numeral S1, in the P-type drive. In other words, only holes current flows in the organic semiconductor layer, but no electron is injected to the organic semiconductor layer.

Meanwhile, when the channel length is L=0.8 μm, a dispersion region appears as shown with a reference numeral S2. It indicates that electrons are injected from the drain electrode 4 to the organic semiconductor light-emitting layer 50. In other words, according to the structure of the embodiment where the channel length L is 1 μm or less (specifically 0.8 μm), to the organic semiconductor light-emitting layer 50 composed by the monolayer of the P-type organic semiconductor material which can inherently transport only holes, electrons are injected from the drain electrode 4 while holes are injected from the source electrode 3, and then light emission following the recombination of those is caused.

FIG. 13(A) shows a luminance characteristic for drain voltage in the case of channel length L=0.8 μm, and FIG. 13(B) shows a luminance characteristic for drain voltage in the case of channel length L=9.8 μm. From the comparison of these, it is understood that the case of channel length L=0.8 μm according to the structure of the embodiment can achieve about 5 times of luminance stronger than the case where channel length is 9.8 μm.

FIG. 14(A) is a characteristic chart showing a quantum efficiency for drain voltage in the organic semiconductor light-emitting device according to the embodiment in the case of channel length L=0.8 μm, FIG. 14(B) shows a characteristic in the same in the case of channel length L=9.8 μm. From the comparison of these, it is understood that the case of the channel length L=0.8 μm according to the structure of the embodiment can achieve about 10 times of quantum efficiency higher than the case where the channel length is 9.8 μm.

FIGS. 15(A) to 15(C) are diagrams for describing a mechanism of light emission in the organic semiconductor light-emitting layer 50 formed of the P-type organic semiconductor material. FIG. 15(A) corresponds the case where the channel length L is 1 μm or less, and FIG. 15(B) corresponds the case where the channel length L is about 10 μm. FIG. 15(C) is a band structure diagram corresponding to FIG. 15(A).

When a negative voltage Vg is applied to the gate electrode 1, a channel 51 of holes is formed near the boundary of the silicon oxide film 2 in the organic semiconductor light-emitting layer 50, and a pinch-off point 52 of the channel 51 reaches the proximity of the drain electrode 4.

However, as shown in FIG. 15(B), when the channel length L is long, electric intensity formed between the pinch-off point 52 and the drain electrode 4 is not sufficiently high, so that the electrons in the drain electrode 4 cannot easily go through the potential barrier between the drain electrode 4 and the organic semiconductor light-emitting layer 50.

On the contrary, as shown in FIG. 15(A), when the channel length L is sufficiently short, a high electrical field is formed between the pinch-off point 52 and the drain electrode 4 to sharply bend the energy band. This allows the electrons in the drain electrode 4 to go through the potential barrier between drain electrode 4 and the organic semiconductor light-emitting layer 50, to be injected into the organic semiconductor layer 5, and then to generate recombination with holes.

Furthermore, as can be understood from the comparison of FIGS. 15(A) and 15(B), by making the channel length L short, a high electrical field generates between the pinch-off point and the drain electrode, which heighten the injection efficiency of the electrons from the drain electrode 4, while recombination efficiency of holes and electrons is heighten. This improves light emission efficiency.

It is just a presumption but the excitation of the P-type organic semiconductor material (TPTPT) derived from the high electrical field generated between the pinch-off point 52 and the drain electrode 4, in addition to the aforementioned FN (Fowler-Nordheim) tunneling effect in which electrons goes through the potential barrier, can be considered as a mechanism of electrons injection from the drain electrode 4 to the organic semiconductor light-emitting layer 5.

Figure 16:
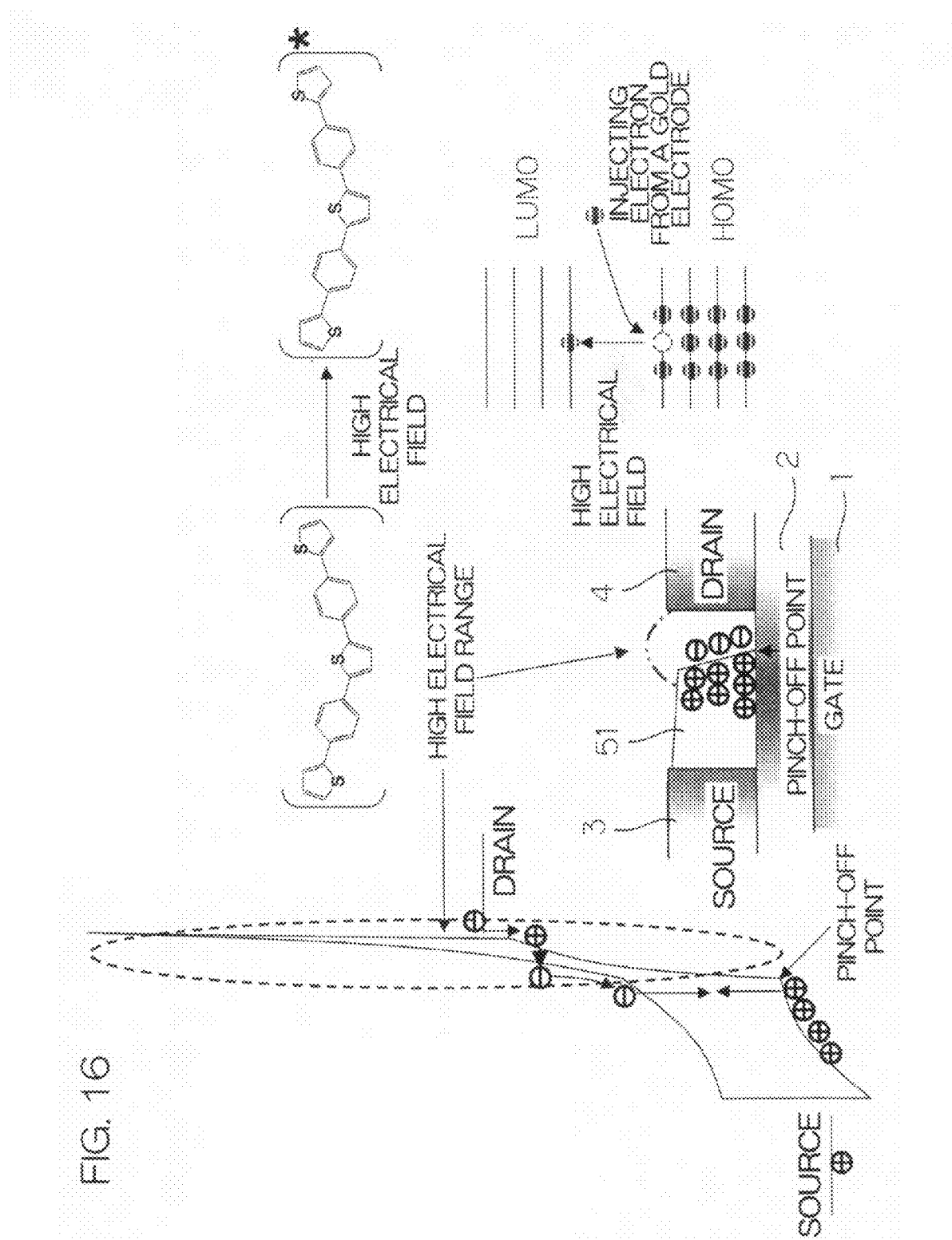
FIG. 16 is a diagram for describing another mechanism of light emission in an organic semiconductor light-emitting layer.

More specifically, as shown in FIG. 16, HOMO energy level electrons in the P-type organic semiconductor material are excited to shift to LUMO energy level by the high electrical field, generating recombination with holes in the organic semiconductor light-emitting layer 50. At the same time, HOMO energy level which is vacant due to excitation to LUMO energy level is supplied with the electrons injected from the drain electrode 4.

It is preferable that a light-emitting material is doped to the organic semiconductor light-emitting layer 50 which is formed of the P-type semiconductor material. This further improves light emission efficiency.

It is preferable that the light-emitting material to be doped is an organic semiconductor material having less energy difference between HOMO energy level and LUMO energy level than one of TPTPT as the P-type organic semiconductor material. For such light-emitting material, material having over 90% of light emission quantum yield, such as Rubrene, DCM, fluorene compound, compound including stilbene, and acene derivative are preferable. Additionally, platinum complex such as PtOEP which is phosphor material, and metal complex such as iridium complex can be used. Furthermore, by selecting the substitute of compound to enlarge conjugated system, HOMO energy level and LUMO energy level can be controlled.

Doping a light-emitting material to the organic semiconductor light-emitting layer 50 may be carried out, for example, by codepositing TPTPT and a light-emitting material to form the organic semiconductor light-emitting layer 50.

In addition, in order to enhance injection efficiency of holes and electrons to the organic semiconductor light-emitting layer 50, the source electrode 3 and the drain electrode 4 can be configured with a laminated structure film formed of MgAu alloy layer and Au layer. Furthermore, the source electrode 3 and the drain electrode 4 may be entirely composed by MgAu alloy, respectively.

Figure 17:
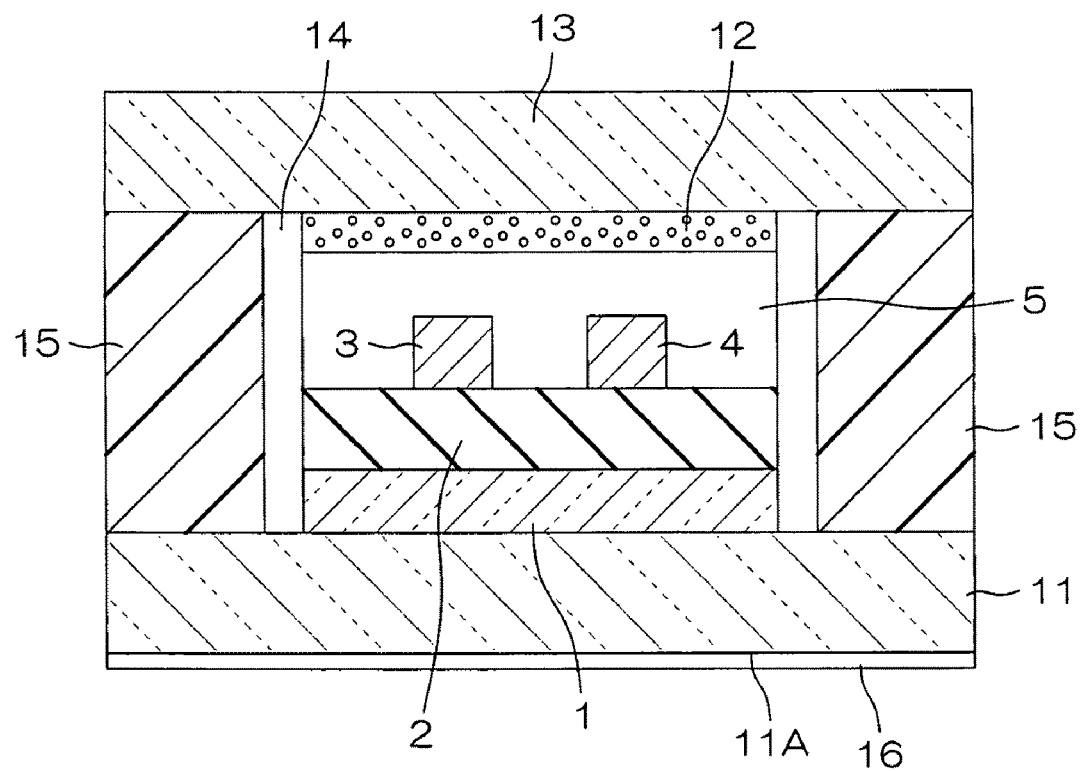
FIG. 17 is a schematic sectional view for describing an arrangement of an organic semiconductor light-emitting device according to the fourth embodiment of the present invention.

FIG. 17 is a schematic sectional view for describing an arrangement of an organic semiconductor light-emitting device according to a fourth embodiment of the present invention. In FIG. 17, each element corresponding to the element shown in FIG. 1 will be given identical reference numeral in FIG. 1.

An organic semiconductor light-emitting device in this embodiment has a structure in which a gate electrode 1 formed of transparent conductive film is disposed on a glass substrate 11 as transparent substrate and a source electrode 3 and a drain electrode 4 are arranged on the gate electrode 1 through a silicon oxide film 2. Further, the source electrode 3 and the drain electrode 4 are coated, while an organic semiconductor light-emitting layer 5 is disposed in a region between the source electrode 3 and drain electrode so as to oppose to the gate electrode 1 through silicon oxide film 2. An organic semiconductor light-emitting layer 50 formed of monolayer of P-type organic semiconductor material shown in FIG. 11 may be disposed instead of the organic semiconductor light-emitting layer 5. In this case, it is preferable to set a channel length L which is the distance between the source electrode 3 and the drain electrode 4 to 1.0 μm or less.

On the surface of the organic semiconductor light-emitting layer 5, a drying agent layer 12 is disposed to prevent the organic semiconductor light-emitting layer 5 from absorbing moisture, and further a glass substrate 13 as support substrate for supporting the drying agent layer 12 is disposed on the drying agent layer 12. An adhesion layer 15 is interposed between the glass substrates 11, 13 to fix these substrates to each other and to form an enclosed space 14 by enclosing a space where the organic semiconductor light-emitting layer 5 and the drying agent layer 12 are arranged. Further, a polarizer 16 for improving visibility is disposed on a light extracting side surface 11A which is the opposite surface to the organic semiconductor light-emitting layer 5 on the glass substrate 11.

The transparent conductive film forming the gate electrode 1 comprises transparent conductive material such as ITO (indium tin oxide), IZO (indium zinc oxide) or ZnO (zinc oxide). Furthermore, the adhesion layer 15 comprises epoxy resin, for example. In addition, the drying agent layer 12 comprises barium oxide, for example.

In this structure, light is extracted to the side of the glass substrate 11 as transparent substrate, and this light is observed through the polarizer 16. Since the organic semiconductor light-emitting layer 5 is enclosed in the enclosed space 14 where the drying agent layer 12 is disposed, the change of properties due to moisture absorption can be restrained or prevented, which can realize the long life organic semiconductor light-emitting device.

Additionally, in the structure shown in FIG. 17, a lens (similar one as the lens 6 in FIG. 1) to enhance light extract efficiency may be interposed between the glass substrate 11 and the polarizer 16.

Figure 18:
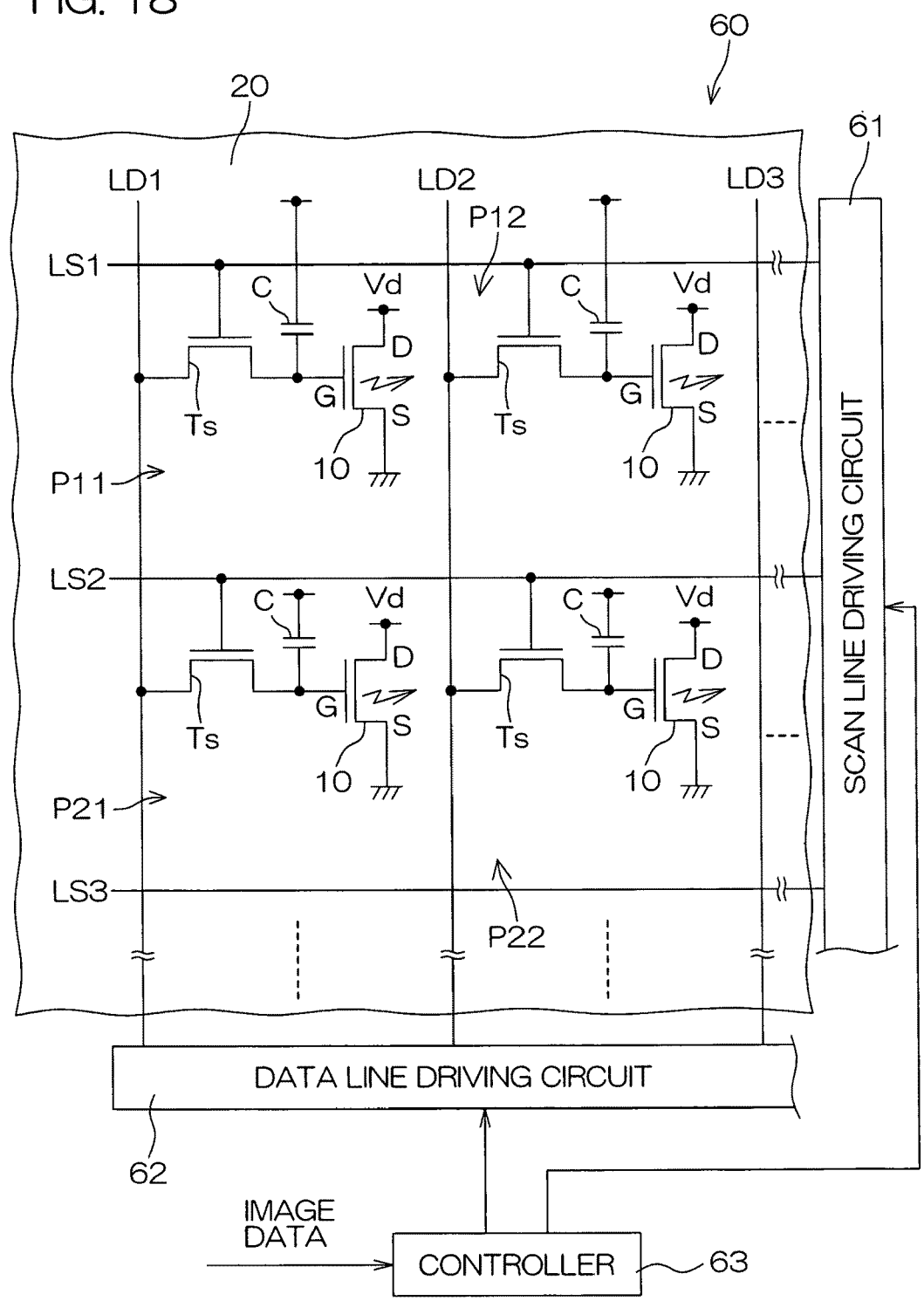
FIG. 18 is an electric circuit diagram of a display configured by two-dimensionally arranging organic semiconductor light-emitting devices on a substrate.

FIG. 18 shows an electrical circuit diagram of a display device 60 in which organic semiconductor light-emitting devices 10 having a structure shown in FIGS. 1, 10, 11 or FIG. 17 are arranged two-dimensionally on a substrate 20. More specifically, the display device 60 has the aforementioned organic semiconductor light-emitting devices 10 respectively arranged in matrix-arrayed pixels P11, P12, . . . , P21, P22, . . . , and makes it possible to achieve two-dimensional display by selecting in these pixels the organic semiconductor light-emitting devices 10 that are to emit light and by controlling light intensity (luminance) of the organic semiconductor light-emitting devices 10 in these pixels. For the substrate 20, in the case of the structure of FIG. 1, FIG. 10 or FIG. 11, for example, it may be a silicon substrate integrated with the gate electrode 1. That is, the gate electrode 1 can be constructed by a conductive layer comprising an impurity dispersion layer which is pattern formed on the surface of a silicon substrate. When the structure shown in FIG. 17 is adopted, the glass substrate 11 can be used as the substrate 20.

When the P-type drive is carried out in each organic semiconductor light-emitting device 10, its drain electrode 4(D) is supplied with bias voltage Vd (<0), and its source electrode 3(S) is set to ground potential (=0). To the gate 1(G), a selective transistor $T_s$ for selecting each pixel and a capacitor C for preserving data are connected in parallel.

The pixels P11, P12, . . . ; P21, P22 . . . are aligned in rows. In these pixels, the selective transistors $T_s$ in each line have gates respectively connected as a group to their common scanning lines LS1, LS2, . . . . The pixels P11, P21 . . . ; P12, P22 . . . are aligned in columns. In these pixels, in the opposite side of the organic semiconductor light-emitting device 10, the selective transistors $T_s$ have gates connected respectively to their common data lines LD1, LD2, etc.

To scanning lines LS1, LS2, . . . , a scan drive signal is given from a scanning line driving circuit 61 that is controlled by a controller 63. The signal circulates pixels P11, P12, . . . ; P21, P22 . . . in each row and sequentially selects a plurality of pixels in a row collectively. More specifically, the scanning line driving circuit 61 sequentially scans each line and determines which line to be conducted or blocked and generates scan drive signal. With the signal, the selective transistors $T_s$ in a plurality of pixels in a selected line are made conductive. The selective transistors $T_s$ in a plurality of pixels in a non-selected line are blocked.

On the other hand, to data lines LD1, LD2, a signal is input from a data line driving circuit 62. To the data line driving circuit 62, a control signal corresponding to image data is input from the controller 63. The data line driving circuit 62 transmits a light emission control signal corresponding to gradation of light of each pixel in the selected lines to the data lines LD1, LD2, . . . , in parallel, at the time when the scanning line driving circuit 61 selects a plurality of pixels in each line collectively.

Consequently, in each pixel of the selected lines, a light emission control signal is transferred to the gate electrode 1(G) through the selective transistor $T_s$, allowing the organic semiconductor light-emitting device 10 of the selected pixel to emit light (or distinguish light) at gradation in accordance with the light emission control signal. Since the light emission control signal is preserved at a capacitor C, the electric potential of the gate electrode G is preserved even after the lines selected by the scanning line driving circuit 61 moves to other lines, thus preserving the lighting state of the organic semiconductor light-emitting device 10. In this manner, two-dimensional display is enabled.

The four embodiments of the present invention were described above, but this invention can be implemented in other embodiments. For example, instead of NTCDA used in the first and the second embodiments, $C_6$-NTC (Chemical Formula 3 below) or $CH_2C_6F_{13}$-NTC (Chemical Formula 4 below) may be used as an N-type organic semiconductor material. These materials have less accepter performance than NTCDA, so that improved quantum yield can be expected.

[Chemical Formula 3]

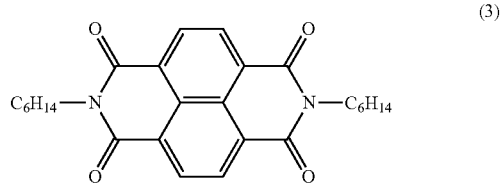

[Chemical Formula 4]

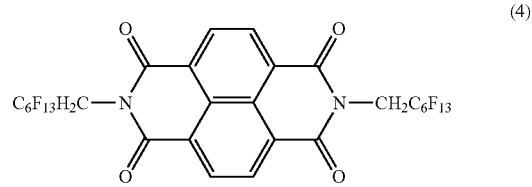

Furthermore, for material of the source electrode 3 and the drain electrode 4, magnesium, palatine, aluminum, ITO, IZO, etc. can be adopted in addition to gold. Moreover, for the gate insulating film, silicon nitride film, PMMA (polymethyl methacrylate) film, alumina film, tantalum oxide film, etc. can be adopted in addition to silicon oxide film.

The film thickness of the organic semiconductor light-emitting layer is not specifically limited, but it is preferable to keep the light extraction efficiency controllable to be maximum due to cross protection. Specifically, it is preferable that film thickness $t=(2k+1)\cdot(\lambda/4n)$ (where, k=0, 1, 2, 3, . . . ) where the refractive index of the organic semiconductor light-emitting layer is n, the emission length thereof is $\lambda$.

The display which can display two-dimensionally is shown in FIG. 18, but one-dimensional display also can be constructed by arranging pixels one-dimensionally.

Though embodiments according to the present invention have been described in detail above, these are merely specific examples used to clarify the technical details of the present invention. The present invention should thus not be interpreted as being restricted to these specific examples and the spirit and the scope of the present invention are restricted only by the appended claims.

The present Application corresponds to Japanese Patent Application No. 2004-250600 submitted to the Japan Patent Office on Aug. 30, 2004, the entire disclosure of which is incorporated herein by reference.

What is claimed is:

1. An organic semiconductor light-emitting device, comprising:
    a substrate;
    an organic semiconductor light-emitting layer for transporting electrons and holes, and emitting light by recombination of the holes and the electrons;
    a gate electrode, disposed along a surface of the substrate, for controlling distribution of carriers in the organic semiconductor light-emitting layer;
    a hole injecting electrode for injecting holes into the organic semiconductor light-emitting layer; and
    an electron injecting electrode for injecting electrons into the organic semiconductor light-emitting layer, the electron injecting electrode being spaced a predetermined distance from the hole injecting electrode in a direction along the surface of the substrate, wherein the gate electrode is disposed facing the organic semiconductor light-emitting layer between the hole injecting electrode and the electron injecting electrode.

2. The organic semiconductor light-emitting device according to claim 1, wherein the organic semiconductor light-emitting layer comprises a P-type organic semiconductor material which is a hole transporting material and an N-type organic semiconductor material which is an electron transporting material.

3. The organic semiconductor light-emitting device according to claim 2, wherein the organic semiconductor light-emitting layer comprises a mixture of a P-type organic semiconductor material and an N-type organic semiconductor material.

4. The organic semiconductor light-emitting device according to claim 3, wherein the organic semiconductor light-emitting layer is made by codeposition to include the P-type organic semiconductor material and the N-type organic semiconductor material.

5. The organic semiconductor light-emitting device according to claim 3, wherein the organic semiconductor light-emitting layer further includes a light-emitting material forming an emission center.

6. The organic semiconductor light-emitting device according to claim 5, wherein the organic semiconductor light-emitting layer is made by codeposition to include the P-type organic semiconductor material, the N-type organic semiconductor material and the light-emitting material.

7. The organic semiconductor light-emitting device according to claim 5, wherein the light-emitting material has a less difference between HOMO energy level and LUMO energy level than either one of the P-type semiconductor material and the N-type organic semiconductor material.

8. The organic semiconductor light-emitting device according to claim 2, wherein the organic semiconductor light-emitting layer has a laminated structure in which a P-type organic semiconductor layer formed of the P-type organic semiconductor material and an N-type organic semiconductor layer formed of the N-type organic semiconductor material are laminated.

9. The organic semiconductor light-emitting device according to claim 2, wherein the P-type organic semiconductor material comprises a co-oligomer of thiophene and phenylene.

10. The organic semiconductor light-emitting device according to claim 2, wherein the N-type organic semiconductor material comprises a naphthalene anhydride.

11. The organic semiconductor light-emitting device according to claim 1, wherein the hole injecting electrode and the electron injecting electrode respectively have comb shape portions arranged in spaced relation which are configured to be engaged with each other.

12. A display comprising a plurality of the organic semiconductor light-emitting devices according to claim 1 arranged on a substrate.

13. The organic semiconductor light-emitting device according to claim 6, wherein the light-emitting material has a less difference between HOMO energy level and LUMO energy level than either one of the P-type semiconductor material and the N-type organic semiconductor material.

14. The organic semiconductor light-emitting device according to claim 1, further comprising a gate insulating film disposed along the surface of the substrate and covering the gate electrode.

15. An organic semiconductor light-emitting device, comprising:
    a substrate;
    an organic semiconductor light-emitting layer for transporting electrons and holes, and emitting light by recombination of the holes and the electrons;
    a gate electrode, disposed along a surface of the substrate, for controlling distribution of carriers in the organic semiconductor light-emitting layer;
    a hole injecting electrode for injecting holes into the organic semiconductor light-emitting layer; and
    an electron injecting electrode for injecting electrons into the organic semiconductor light-emitting layer, the electron injecting electrode being spaced a predetermined distance from the hole injecting electrode in a direction along the surface of the substrate, wherein the hole injecting electrode and the electron injecting electrode are disposed between the gate electrode and the organic semiconductor light-emitting layer.

* * * * *